(12) United States Patent
Fechner

(10) Patent No.: US 6,433,983 B1
(45) Date of Patent: Aug. 13, 2002

(54) HIGH PERFORMANCE OUTPUT BUFFER WITH ESD PROTECTION

(75) Inventor: Paul S. Fechner, Plymouth, MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/449,312

(22) Filed: Nov. 24, 1999

(51) Int. Cl.$^7$ ............... H02G 9/00; H03K 19/0175
(52) U.S. Cl. ............... 361/111; 361/56; 327/437; 326/83
(58) Field of Search ............... 361/111, 56, 54; 327/306, 427, 434, 437; 326/62, 82, 83, 81

(56) References Cited

U.S. PATENT DOCUMENTS

| | | | |
|---|---|---|---|
| 4,710,842 A | | 12/1987 | Suzuki et al. |
| 4,930,112 A | | 5/1990 | Tanaka et al. |
| 5,017,811 A | | 5/1991 | Worley |
| 5,381,059 A | | 1/1995 | Douglas |
| 5,532,178 A | | 7/1996 | Liaw et al. |
| 5,631,793 A | * | 5/1997 | Ker et al. ............ 361/111 |
| 5,732,027 A | * | 3/1998 | Arcoleo et al. ........ 365/189.05 |
| 5,754,380 A | * | 5/1998 | Ker et al. ............ 361/111 |
| 5,793,069 A | | 8/1998 | Schuelein et al. |
| 5,867,053 A | | 2/1999 | Engles et al. |
| 5,880,603 A | | 3/1999 | Shigehara et al. |
| 6,147,513 A | * | 11/2000 | Bui ............... 326/83 |

FOREIGN PATENT DOCUMENTS

| | | |
|---|---|---|
| DE | 40 04 381 A | 1/1991 |
| EP | 0 634 795 A | 1/1995 |
| WO | WO 97 08831 A | 3/1997 |

OTHER PUBLICATIONS

"High Speed SOI Buffer Circuit with the Efficient Connection of Subsidiary MOSFET's for Dynamic Threshold Control", Jong–Ho Lee and Yong–June Park, Proceedings of the 1997 IEEE International SOI Conference, Oct. 1997, pp. 152–153.

"CMOS–On–SOI ESD Protection Networks", S. Voldman et al., EOS/ESD Symposium, 1996, pp. 291–301.

"Dynamic Threshold Body–and Gate–Coupled SOI ESD Protection Networks", S. Voldman et al., EOS/ESD Symposium, 1997, pp. 211–221.

"A Novel Dynamic Vt Circuit Configuration" T.W. Houston, Proceedings of 1997 IEEE Internation SOI Conference, Oct. 1997, pp. 154–155.

* cited by examiner

Primary Examiner—Kim Huynh
(74) Attorney, Agent, or Firm—Dennis C. Bremer

(57) ABSTRACT

An output buffer with built-in ESD protection is disclosed. The built-in ESD protection is preferably formed using transistors from the sea-of-transistors or sea-of-gates region of the integrated circuit, which may eliminate the need for dedicated ESD devices, and in particular, dedicated ESD devices that are pre-fabricated into the under-layers in and around the perimeter of the integrated circuit.

23 Claims, 13 Drawing Sheets

HIGH PERFORMANCE OUTPUT BUFFER WITH ESD PROTECTION

BACKGROUND OF THE INVENTION

This invention relates to output buffers, and more particularly to high performance output buffers with built-in ESD protection. The term output buffer, as used herein, refers to all circuits that buffer electrical signals including amplifying and non-amplifying circuits or devices.

Moore's Law, which is named after Gordon Moore, the founder of Intel Corporation, states that the speed and density of computers will double every 18–24 months. For the most part, Moore's Law has held true since the early days of the microprocessor, and is predicted to do so for at least another twenty years.

A corollary to Moore's Law is that the size of the transistors used on an integrated circuit must shrink by a factor of two every 18–24 months. Until recently, this was accomplished by simply scaling bulk MOSFET devices. However, as the transistor channel lengths scale below about 0.25 um, a number of transistor effects begin to degrade the transistor's characteristics. Some of these effects include short-channel effects, gate resistance effects, channel profiling effects and other effects. It has been found that reducing the power supply voltage can reduce some of these effects. However, reducing the power supply voltage can also severely impact the performance of the MOSFET devices.

One approach for overcoming many of these limitations is to use a Silicon-On-Insulator (SOI) substrate. SOI has significant advantages over bulk CMOS including lower power consumption, lower leakage current, lower capacitance, good sub-threshold IV characteristics, lower soft error rates for both alpha particles and cosmic rays, etc. These advantages make SOI an ideal technology for high performance, low voltage applications.

Another advantage of SOI is that the body of each transistor can be separately controlled. As discussed in "High Speed SOI Buffer Circuit with the Efficient Connection of Subsidiary MOSFET's for Dynamic Threshold Control", Lee et al., Proceedings 1997 IEEE International SOI Conference, October 1997, page 152, this allows the threshold voltage of each transistor to be dynamically controlled, particularly at low supply voltages. Dynamically adjusting the threshold voltages can significantly increase the performance that can be achieved at low supply voltages.

One of the challenges for providing viable SOI devices is the need to provide adequate electrostatic discharge (ESD) protection. ESD is an increasingly significant problem in integrated circuit design, and in particular, SOI integrated circuit design. Potentially destructive electrostatic pulses, which are known as ESD events, are typically caused by various transient sources such as human or machine handling of the integrated circuit chip during processing, assembly and installation. Most ESD events originate at one of the integrated circuit pads. Since output buffers are typically connected to an integrated circuit pad, it is desirable to provide some sort of ESD protection to the output buffer circuitry.

A typical ESD event includes a high voltage pulse to the output pad, resulting in a high discharge current path through one of the PMOS or NMOS transistors of the output buffer to Vdd or Vss, respectively. For the NMOS transistor, and depending upon the polarity of the ESD voltage pulse supplied to the pad, the discharge path may proceed either via an avalanche breakdown of the drain/body junction or via the forward biasing of the drain/body diode. The avalanche breakdown type of discharge path is the most destructive since it is most likely to result in irreversible damage to the structure of the NMOS transistor. A similar discharge path may exist through the PMOS transistor.

Several approaches for providing ESD protection to SOI CMOS integrated circuits are discussed in "CMOS-On-SOI ESD Protection Networks", Voldman et al., EOS/ESD Symposium 96-291, page 6.5.1, and "Dynamic Threshold Body- and Gate-Coupled SOI ESD Protection Networks", Voldman et al., EOS/ESD Symposium 97-211, page 3A.2.2. A limitation of many of these prior art approaches is that one or more dedicated devices must be provided to implement the ESD protection function. These dedicated ESD devices are often relatively large, and thus consume a substantial amount of area. Further, the dedicated ESD devices are typically pre-fabricated in and around the perimeter of the device near the I/O pads, and thus are not part of the sea-of-transistors or sea-of-gates region of the integrated circuit. Instead, and as indicated above, they are typically fabricated into the under-layers of the outer perimeter of the integrated circuit, regardless of whether they are actually used in a particular Application Specific Integrated Circuit (ASIC) personality or configuration.

What would be desirable, therefore, is an output buffer with built-in ESD protection, wherein the ESD protection is provided at least in part by selected transistors in the sea-of-transistors or sea-of-gates region of the integrated circuit. This may eliminate the need for at least some of the dedicated "ESD" devices, and in particular, those dedicated ESD devices that are pre-fabricated into the under-layers in and around the perimeter of the integrated circuit. An advantage of such an approach is that only those transistors that are actually needed to provide the desired ESD protection for the particular ASIC personality or configuration are used, thereby maximizing the overall density of the integrated circuit.

SUMMARY OF THE INVENTION

The present invention overcomes many of the disadvantages of the prior art by providing an output buffer with built-in ESD protection, wherein the ESD protection is implemented at least in part from selected transistors in the sea-of-transistors or sea-of-gates region of the integrated circuit. This may eliminate the need for dedicated "ESD" devices, and in particular, those dedicated ESD devices that are pre-fabricated into the under-layers in and around the perimeter of the integrated circuit.

In a first illustrative embodiment of the present invention, a high performance CMOS buffer is provided with a first p-channel transistor and a first n-channel transistor connected in series between a power supply voltage and ground. The gate of the first p-channel transistor and the gate of the first n-channel transistor are coupled to the input terminal of the CMOS buffer. To increase the speed and to ensure that the body of the first p-channel transistor does not float, a first coupler circuit is provided. The first coupler circuit couples the body of the first p-channel transistor to the output terminal of the CMOS buffer when the gate of the first p-channel transistor is low, and couples the body of the first p-channel transistor to the power supply terminal of the CMOS buffer when the gate of the first p-channel transistor is high.

Likewise, to increase the speed and to ensure that the body of the first n-channel transistor does not float, a second coupler circuit is provided. The second coupler circuit couples the body of the first n-channel transistor to the output terminal of the CMOS buffer when the gate of the first n-channel transistor is high, and couples the body of the first n-channel transistor to the ground terminal of the CMOS buffer when the gate of the first n-channel transistor is low.

Preferably, the first coupler circuit includes a second p-channel transistor and a second n-channel transistor. The source and body of the second p-channel transistor is preferably coupled to the power supply terminal of the CMOS buffer. The drain of the second p-channel transistor is preferably coupled to the body of the first p-channel transistor. Finally, the gate of the second p-channel transistor is preferably coupled to the input terminal of the CMOS buffer. The source of the second n-channel transistor is preferably coupled to the body of the first p-channel transistor. The body and drain of the second n-channel transistor are preferably coupled to the output terminal of the CMOS buffer. Likewise, the gate of the second n-channel transistor is preferably coupled to the input terminal of the CMOS buffer.

The second coupler circuit preferably includes a third p-channel transistor and a third n-channel transistor. The drain of the third p-channel transistor is preferably coupled to the body of the first n-channel transistor. The body and source of the third p-channel transistor are preferably coupled to the output terminal of the CMOS buffer. The gate of the third p-channel transistor is preferably coupled to the input terminal of the CMOS buffer. Finally, the source and body of the third n-channel transistor are preferably coupled to the ground terminal of the CMOS buffer. The drain of the third n-channel transistor is preferably coupled to the body of the first n-channel transistor. The gate of the third n-channel transistor is preferably coupled to the input terminal of the CMOS buffer.

To help provide ESD protection to the CMOS buffer, a third coupler circuit may also be provided. The third coupler circuit preferably couples the gate of the first n-channel transistor to the output terminal of the CMOS buffer when the voltage at the output terminal of the CMOS buffer exceeds the voltage of at power supply terminal by a predetermined amount. This causes the first n-channel transistor to turn on when an ESD event drives the output terminal of the CMOS buffer higher than Vdd, thereby providing a path for the ESD current to the Vss power supply.

When the third coupler circuit is used in conjunction with the second coupler circuit discussed above, the body and gate of the first n-channel transistor are both coupled to the Vout terminal of the CMOS buffer when an ESD event drives Vout higher than Vdd. Preferably, the third p-channel transistor of the second coupler circuit turns on when Vout goes above Vdd by a threshold voltage, thereby connecting the body of the first n-channel transistor to Vout. Likewise, the third coupler circuit couples the gate of the first n-channel transistor to Vout of the CMOS buffer when the voltage at Vout exceeds Vdd by a predetermined amount. Thus, both the body and gate of the first n-channel transistor are coupled to the Vout terminal of the CMOS buffer when an ESD event drives Vout higher than Vdd by a predetermined amount.

This has a number of advantages. First, there is little or no voltage drop between the gate, body, source and drain of the first n-channel transistor during an ESD event. Therefore, there is little chance of stressing the thin gate oxide of the first n-channel transistor during the ESD event. Also, the voltage that can be applied at Vout without causing destructive breakdown phenomena is maximized. Destructive breakdown often results from concentrated dissipation heating, rather than spreading the heat over the full device area. Accordingly, Vout should be able to rise to the gate-to-source breakdown voltage before causing any significant catastrophic damage to the device. Another advantage is that because the gate and body are at about the same potential, the threshold voltage of the first n-channel transistor is minimized, and the bipolar current of the parasitic bipolar transistor of the first n-channel transistor is maximized. Both of these help provide a low resistance path to Vss during an ESD event.

It is contemplated that a fourth coupler circuit may also be provided. The fourth coupler circuit may couple the gate of the first p-channel transistor to the output terminal of the CMOS buffer when the voltage at the output terminal of the CMOS buffer drops below the voltage at the ground terminal by a predetermined amount. Like the third coupler circuit, the fourth coupler circuit causes the first p-channel transistor to turn on when an ESD event drives the output terminal of the CMOS buffer below Vss, thereby providing a low resistance path to the Vdd power supply.

When the fourth coupler circuit is used in conjunction with the first coupler circuit discussed above, the body and gate of the first p-channel transistor are both coupled to the Vout terminal of the CMOS buffer when an ESD event drives Vout lower than Vss. Preferably, the second n-channel transistor of the first coupler circuit turns on when Vout drops below Vss by a threshold voltage, thereby connecting the body of the first p-channel transistor to Vout. Likewise, the fourth coupler circuit preferably couples the gate of the first p-channel transistor to Vout of the CMOS buffer when the voltage at Vout drops below Vss by a predetermined amount. Thus, both the body and gate of the first p-channel transistor are coupled to the Vout terminal of the CMOS buffer when an ESD event drives Vout below Vss by a predetermined amount. This has the same advantages as discussed above.

A fifth coupler circuit may also be provided. The fifth coupler circuit may be used to prevent feedback from Vout to Vdd when an ESD event causes Vout to rise above Vdd. In some applications, it may be desirable to prevent the first p-channel transistor from turning on when Vout rises above Vdd. This is primarily because the ESD event could actually power up the circuit that is biasing the output buffer input terminal (IN) to a state which could reduce the effectiveness of the protection circuit. Accordingly, it is contemplated that the fifth coupler circuit may couple the gate of the first p-channel transistor to the output terminal of the CMOS buffer when the voltage at the output terminal of the CMOS buffer exceeds Vdd by a predetermined amount. This helps keep the first p-channel off when Vout exceeds Vdd. It is contemplated that the first, second, third, fourth and fifth coupler circuits may be used together, separately, or in any combination, depending on the desired result and/or application.

It is also contemplated that the gate of the first p-channel transistor and the gate of the first n-channel transistor may be driven by a common buffer. Alternatively, it is contemplated that the gate of the first p-channel transistor may be driven by a first buffer, and the gate of the first n-channel transistor may be driven by a second buffer. In this later case, both the first buffer and second buffer may be conventional inverter type buffers having an input terminal, an output terminal, a power supply terminal and a ground terminal. As the gate of the first n-channel transistor is driven above Vdd by, for example the third coupler circuit, the p-channel transistor of the second buffer may provide a diode to Vdd. This tends to limit the gate voltage that can be applied to the first n-channel transistor, and may cause Vdd to become charged up. While this may be beneficial for preventing gate-to-source breakdown, it may reduce the potential maximum drive of the first n-channel transistor during an ESD event. A similar scenario may occur relative to the gate of the first p-channel transistor.

To overcome these limitations, it is contemplated that the power supply terminal of the first buffer and the power supply terminal of the second buffer may be coupled to a Vdd1 power supply terminal of a Vdd1 power supply circuit. The Vdd1 power supply circuit preferably provides Vdd to the Vdd1 power supply terminal when Vout is below Vdd, and preferably provides Vout to the Vdd1 power supply terminal when Vout exceeds Vdd by a predetermined amount. This may allow the gate voltage of the first p-channel transistor and the first n-channel transistor to more effectively track Vout.

It is also contemplated that the source and body of the second p-channel transistor of the first coupler circuit may be coupled to the Vdd1 power supply terminal of the Vdd1 power supply circuit. This may help keep the source, body and drain of the second p-channel transistor at the same or similar voltage during an ESD event. If the source and body of the second p-channel transistor are coupled to Vdd, as described above, a conduction path exists from Vout to Vdd via the drain-to-body diode. This conduction path may be desirable in some applications. However, for those applications where it is not desirable, connecting the source and body of the second p-channel transistor to the Vdd1 power supply terminal of the Vdd1 power supply circuit may tend to reduce the amount of ESD current that is conducted to Vdd.

Likewise, it is contemplated that the ground terminal of the first buffer and the ground terminal of the second buffer may be coupled to a Vss1 power supply terminal of a Vss1 power supply circuit. The Vss1 power supply circuit preferably provides Vss to the Vss1 power supply terminal when Vout is above Vss, and provides Vout to the Vss1 power supply terminal when Vout drops below Vss by a predetermined amount.

It is also contemplated that the source and body of the third n-channel transistor of the second coupler circuit may be coupled to the Vss1 power supply terminal of the Vss1 power supply circuit. This may help keep the source, body and drain of the third n-channel transistor at the same or similar voltage during an ESD event. If the source and body of the third n-channel transistor are coupled to Vss, as described above, a conduction path exists from Vout to Vss via the drain-to-body diode. This conduction path may be desirable in some applications. However, for those applications where it is desirable to reduce the ESD current to Vss, connecting the source and body of the third n-channel transistor to the Vss1 power supply terminal of the Vss1 power supply circuit may tend to reduce the amount of ESD current that is conducted to Vss.

For some applications, such as cold spare applications, it is desirable to provide a CMOS buffer with a tri-state output. When in cold spare mode, the CMOS buffer is not generally powered up (Vdd=0) and the output of the driver should be tri-stated so as to not interfere with other signals on the bus. Further, the ESD protection circuitry should not effect the CMOS buffer circuit when the output is within the range of expected bus voltages.

In an illustrative embodiment, this is accomplished by providing a first nand gate, a second nand gate, a first nor gate and a second nor gate. A tri-state-bar input terminal is provided on the CMOS buffer, and an inverter generates a tri-state signal for internal use. The first input terminal of the first nand gate is preferably coupled to the input terminal of the CMOS buffer and the second input terminal of the first nand gate is preferably coupled to the tri-state-bar terminal of the CMOS buffer. Like above, the Vdd power supply terminal of the first nand gate may be coupled to the Vdd1 power supply terminal of a Vdd1 power supply circuit, and the Vss power supply terminal of the first nand gate may be coupled to a Vss1 power supply terminal of a Vss1 power supply circuit. The Vdd1 power supply circuit and the Vss1 power supply circuit are preferably similar to that described above.

The first input terminal of the second nand gate is preferably coupled to the input terminal of the CMOS buffer and the second input terminal of the second nand gate is preferably coupled to the tri-state-bar terminal of the CMOS buffer. The Vdd power supply terminal of the second nand gate is preferably coupled to the Vdd1 power supply terminal of the Vdd1 power supply circuit, and the Vss power supply terminal of the second nand gate is preferably coupled to the output terminal of the CMOS buffer.

The first input terminal of the first nor gate is preferably coupled to the input terminal of the CMOS buffer and the second input terminal of the first nor gate is preferably coupled to the tri-state signal provided by the inverter. The Vdd power supply terminal of the first nor gate is preferably coupled to the Vdd1 power supply terminal of the Vdd1 power supply circuit, and the Vss power supply terminal of the first nor gate is preferably coupled to the Vss1 power supply terminal of the Vss1 power supply circuit.

Finally, the first input terminal of the second nor gate is preferably coupled to the input terminal of the CMOS buffer and the second input terminal of the second nor gate is coupled to the tri-state signal provided by the inverter. The Vdd power supply terminal of the second nor gate is preferably coupled to the output terminal of the CMOS buffer, and the Vss power supply terminal of the second nor gate is preferably coupled to the Vss1 power supply terminal of the Vss1 power supply circuit.

A first p-channel transistor and a first n-channel transistor are preferably provided for driving the output terminal of the CMOS buffer. The source of the first p-channel transistor is preferably coupled to the power supply terminal of the CMOS buffer. The gate of the first p-channel transistor is preferably coupled to the output terminal of the first nand gate. The body of the first p-channel transistor is coupled to the output terminal of the second nand gate.

The source of the first n-channel transistor is preferably coupled to the ground terminal of the CMOS buffer. The gate of the first n-channel transistor is preferably coupled to the output of the first nor gate. Finally, the drain of the first n-channel transistor is preferably coupled to the drain of the first p-channel transistor and further coupled to the output terminal of the CMOS buffer. The body of the first n-channel transistor is preferably coupled to the output terminal of the second nor gate.

The typical requirement for the cold spare function is that both the first p-channel transistor and the first n-channel transistor remain off for Vout less than the specified maximum output buss voltage (Vddbmax). As long as input signal of the CMOS buffer or the tristate_bar signal are low, as they would normally be in the powered down cold spare mode, the Vdd1 power supply circuit pulls the gate and body of first p-channel transistor high with Vout, thereby keeping the first p-channel transistor off and preventing any significant currents between Vout and Vdd. However, to keep the first n-channel transistor off, the tri-state signal must rise with Vout to keep the gate and body of the first n-channel transistor near ground. This is preferably accomplished by connecting the power supply terminal of the tri-state inverter to a second Vdd2 power supply circuit.

The second Vdd2 power supply circuit preferably couples the Vdd2 power supply terminal of the second Vdd2 power supply circuit to Vdd when Vout is below Vdd. The second Vdd2 power supply circuit also preferably couples the Vdd2 power supply terminal of the second Vdd2 power supply circuit to Vout when the voltage at Vout is below a predetermined maximum value but above Vdd. Finally, the second Vdd2 power supply circuit preferably couples the Vdd2 power supply terminal of the second Vdd2 power supply circuit to ground when Vout is above the predetermined maximum value. The predetermined maximum value preferably corresponds to the expected maximum output buss voltage (Vddbmax).

In some cases it is desirable to allow Vout to go below Vss without introducing additional loading. In an illustrative embodiment, this is accomplished by connecting a second Vss2 power supply circuit to the gate from which tristate_bar is generated. The second Vss2 power supply circuit is similar to the second Vdd2 power supply circuit described above. That is, the second Vss2 power supply circuit preferably couples the Vss2 power supply terminal of the second Vss2 power supply circuit to Vss when Vout is above Vss, and coupled the Vss2 power supply terminal of the second Vss2 power supply circuit to the output terminal of the CMOS buffer when Vout drops below Vss but above a predetermined minimum value. Finally, the second Vss2 power supply circuit preferably couples the Vss2 power supply terminal of the second Vss2 power supply circuit to the ground terminal of the CMOS buffer when Vout drops below the predetermined minimum value.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
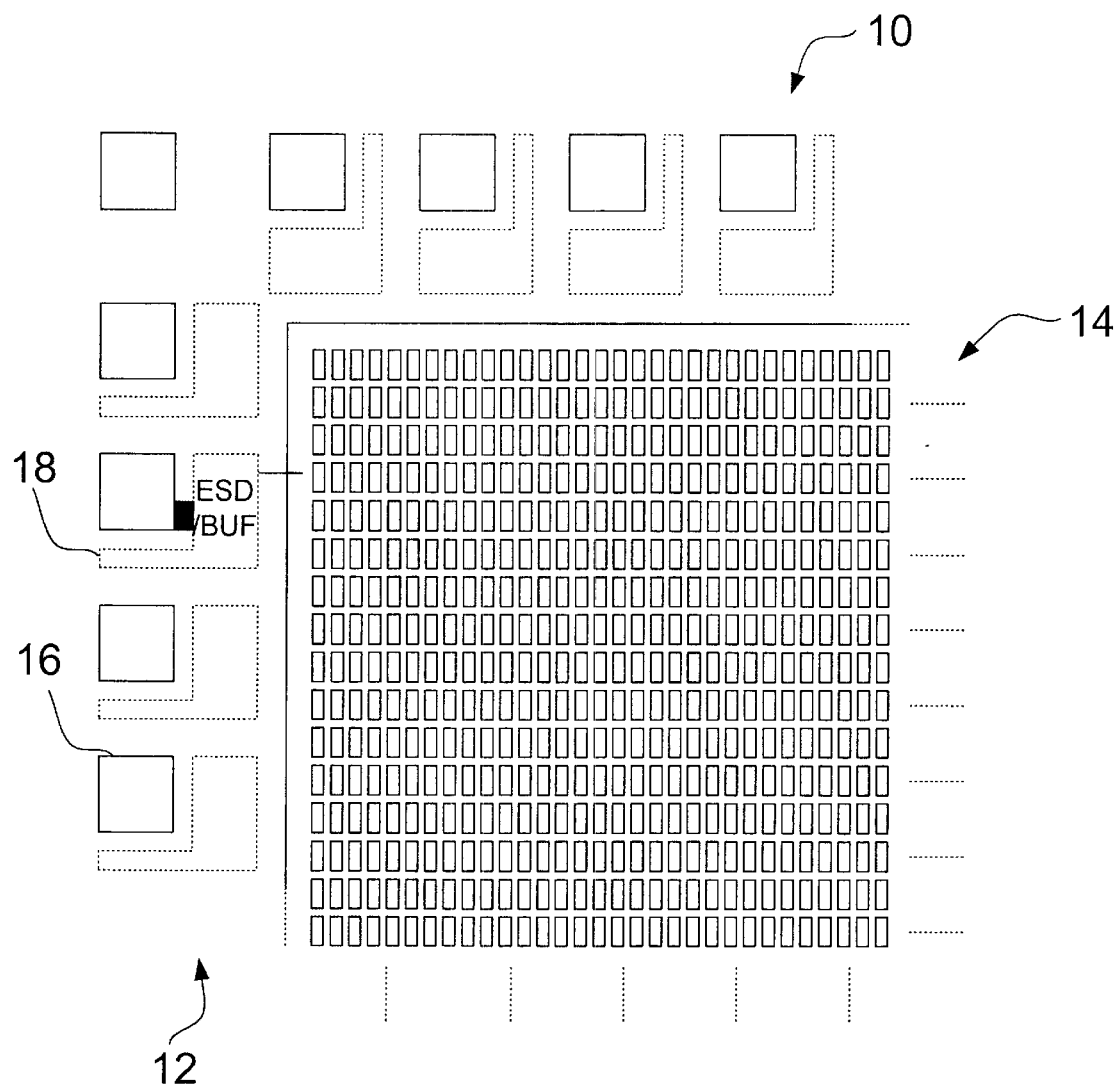
FIG. 1 is a diagram of a typical prior art integrated circuit having dedicated ESD protection circuitry pre-fabricated near each I/O pad.

FIG. 1 is a diagram of a typical prior art integrated circuit having dedicated ESD protection circuitry pre-fabricated near each I/O pad. The integrated circuit is generally shown at 10 and includes a perimeter region 12 and a sea-of-transistors or sea-of-gates region 14. The perimeter region 10 includes a number of I/O pads 16.

Typical prior art integrated circuits 10 use one or more dedicated devices for providing ESD protection for each I/O pad 16. The dedicated ESD devices are often relatively large, and are typically pre-fabricated in and around the perimeter of the device near the I/O pads 16. In the example shown, the dedicated devices for I/O pad 16 are pre-fabricated in region 18. Accordingly, the dedicated ESD devices are not selected from the sea-of-transistors or sea-of-gates region 14 of the integrated circuit 10. This can reduce the overall density of the integrated circuit 10. Often, at least part of an output buffer is also prefabricated in the region 18 near each I/O pad 16.

Depending on the particular Application Specific Integrated Circuit (ASIC) personality or configuration, some of the dedicated devices may not be used. For example, if pad 16 is a power or ground pad, the dedicated devices in region 18 may not be used. This tends to reduce the overall density that can be achieved for the integrated circuit 10.

Figure 2:
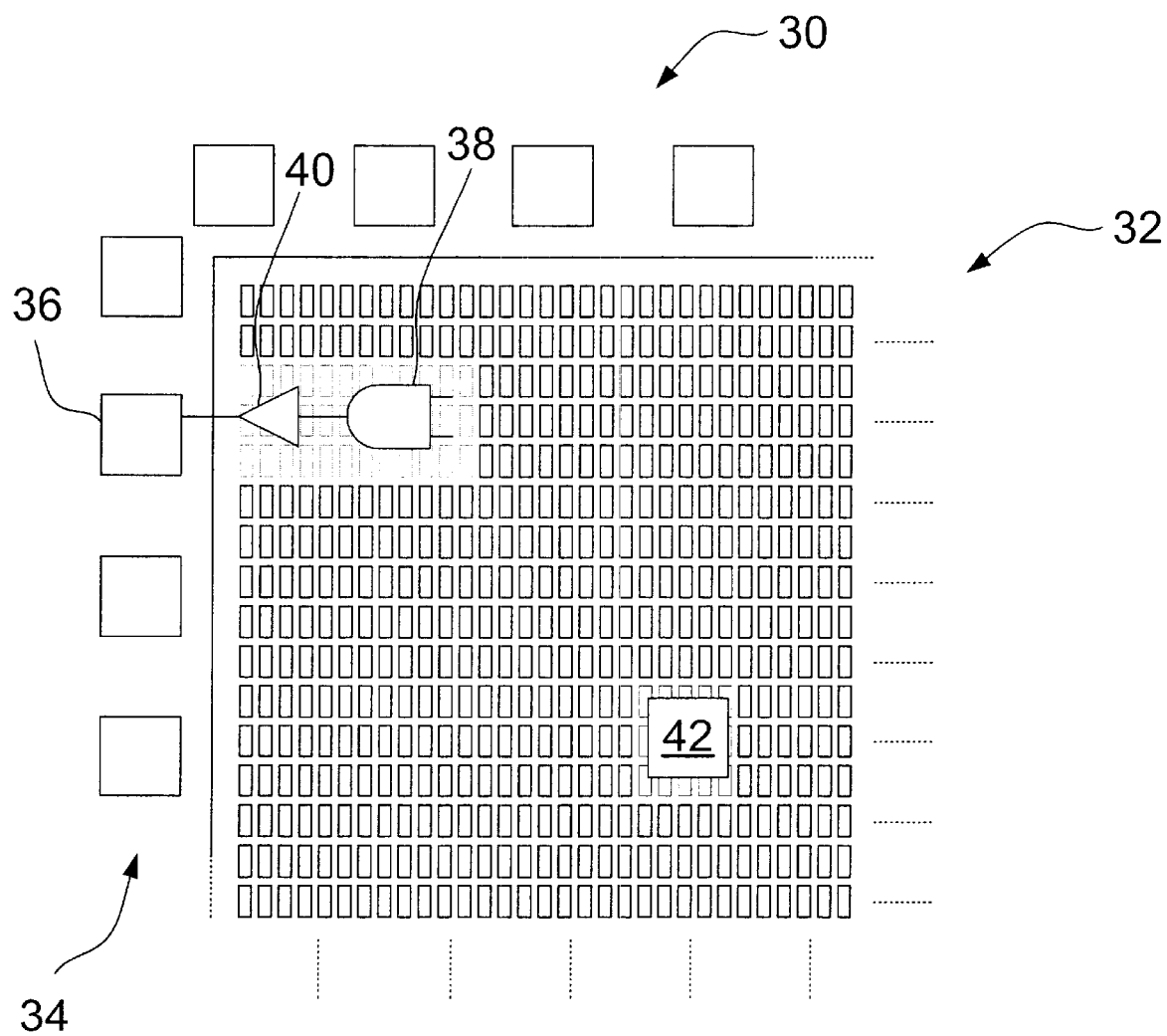
FIG. 2 is an illustrative integrated circuit in accordance with the present invention, where at least part of the ESD protection circuitry is built using the transistors in the sea-of-transistors or sea-of-gates region of the integrated circuit.

FIG. 2 is an illustrative integrated circuit 30 in accordance with the present invention. In the illustrative embodiment, at least part of the ESD protection circuitry is built using the transistors in the sea-of-transistors or sea-of-gates region 32 of the integrated circuit 30. This configuration may eliminate the need for at least some of the dedicated "ESD" devices, and in particular, those devices that are pre-fabricated into the under-layers in and around the perimeter of the integrated circuit. It is also contemplated that at least part of the output buffer 40 may be fabricated using the transistors in the sea-of-transistors or sea-of-gates region 32 of the integrated circuit 30. An advantage of such an approach is that only those transistors that are actually needed to provide the desired buffering and/or ESD protection for the particular ASIC personality or configuration are used, thereby maximizing the overall density of the integrated circuit. Further, and as further described below, the devices that provide the ESD protection may be smaller than the prior art ESD device, which may further increase the density of the integrated circuit 30.

The illustrative CMOS integrated circuit 30 has an internal region 32, including a sea-of-transistors or sea-of-gates region 32 surrounded by a perimeter region 34 having a number of I/O or bond pads 36. In the example shown, a logic circuit 38 is coupled to an output buffer 40, both of which are formed from selected transistors of the array of transistors 32. The output buffer 40 is coupled to one of the I/O pads, such as I/O pad 36. Rather than providing dedicated ESD devices in the perimeter region 34 of the integrated circuit 30, ESD protection circuitry may be formed using selected transistors of the array of transistors 32. As indicated above, this may increase the overall density of the integrated circuit 30. It is contemplated that at least some of the circuitry of the output buffer 40 may still be prefabricated into the underlayers near each I/O pad. However, this is not required.

It is contemplated that one or more I/O pads, such as I/O pad 42, may be provided within the sea-of-transistors or sea-of-gates region 32 of the integrated circuit 30. Preferably, the I/O pad 42 is positioned over the active transistors in the sea-of-transistors or sea-of-gates region 32, allowing the position of the I/O pad 42 to be customized for a particular personalization. If all of the I/O pads are positioned over the sea-of-transistors or sea-of-gates region 32, the integrated circuit may have no dedicated areas, which may increase the density of the integrated circuit 30. This may also allow more pads to be provided, which may be particularly beneficial since many of today's integrated circuits are pad limited. Using solder bump and/or flip chip packaging techniques, the I/O pad 42 may be connected to the I/O pins of the integrated circuit package.

Figure 3:
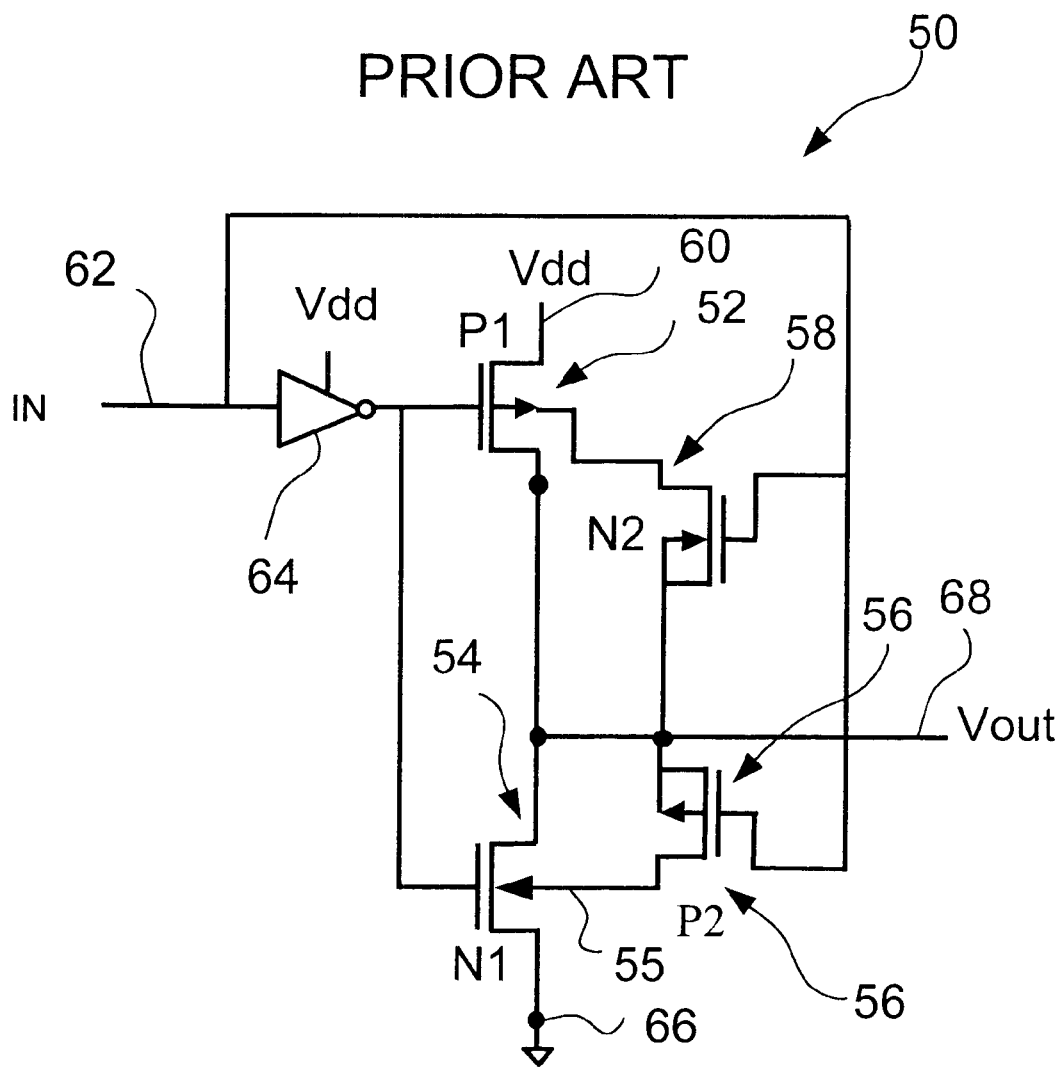
FIG. 3 is a schematic diagram of a prior art high performance SOI driver.

FIG. 3 is a schematic diagram of a prior art high performance SOI driver 50. The output buffer 50 includes a first p-channel transistor 52, a first n-channel transistor 54, a second p-channel transistor 56 and a second n-channel transistor 58. The source of the first p-channel transistor 52 is coupled to the Vdd supply 60. The gate of the first p-channel transistor 52 is controlled by the input terminal 62 of the output buffer 50, preferably by inverter 64.

The source of the first n-channel transistor 54 is coupled to the Vss (ground) terminal 66 of the output buffer 50. The gate of the first n-channel transistor 54 is controlled by the input terminal 62 of the output buffer 50. The drain of the first n-channel transistor 54 is coupled to the drain of the first p-channel transistor 52 and further coupled to the output terminal 68 of the output buffer 50.

The second p-channel transistor 56 and the second n-channel transistor 58 are provided to dynamically control the threshold voltage of the first n-channel transistor 54 and the first p-channel transistor 52, respectively. The source of the second n-channel transistor 58 is coupled to the body of the first p-channel transistor 52. The body and drain of the second n-channel transistor 58 are coupled to the output terminal 68 of the output buffer 50. The gate of the second n-channel transistor 58 is coupled to the input terminal 62 of the output buffer 50.

By coupling the gate of the second n-channel transistor 58 to the input terminal 62 of the output buffer 50, the second n-channel transistor 58 can begin changing the voltage of the body of the first p-channel transistor 52 before the inverter 64 changes the voltage of the gate of the first p-channel transistor 52. This helps set the desired threshold voltage of the first p-channel transistor 52 before the gate is actually switched.

Like the second n-channel transistor 58, the drain of the second p-channel transistor 56 is coupled to the body 55 of the first n-channel transistor 54. The body and source of the second p-channel transistor 56 are coupled to the output terminal 68 of the output buffer 50. Finally, the gate of the second p-channel transistor 56 is coupled to the input terminal 62 of the output buffer 50. For the same reasons discussed above, the second p-channel transistor 56 may help set the desired threshold voltage of the first n-channel transistor 54 before the gate of the first n-channel transistor 54 is actually switched.

One limitation of the above prior art high performance SOI output buffer is that the bodies of the first p-channel transistor 52 and the first n-channel transistor 54 are floating in their off state. This makes them susceptible to high energy particle events and dose rate phenomena. Any current caused by radiation induced electron-hole pairs is multiplied by the beta of the parasitic lateral p-channel and n-channel driver currents, which may cause the first p-channel transistor 52 and the first n-channel transistor 54 to go into snap-back mode. Additionally, floating body transistors normally have higher sub-threshold currents in their off state.

Figure 4:
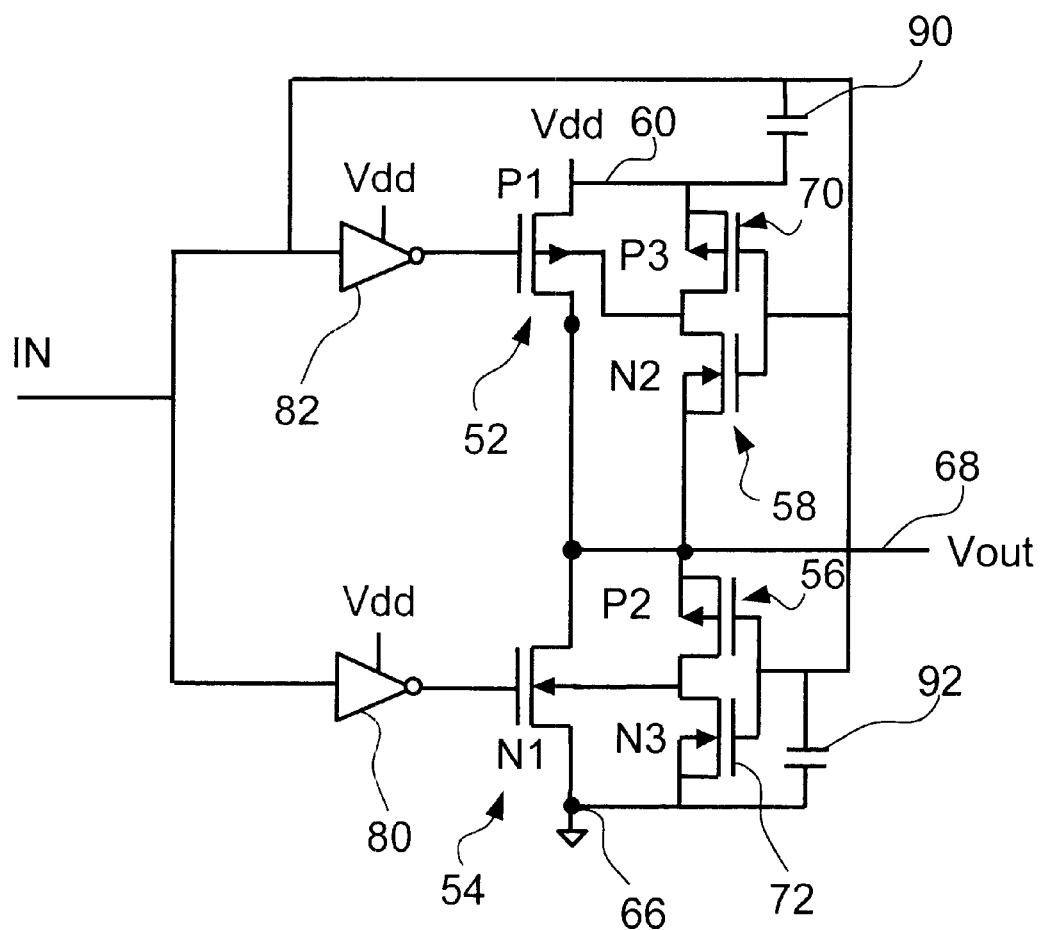
FIG. 4 is a schematic diagram of a high performance SOI driver that is dose rate and single event upset (SEU) hardened in accordance with the present invention.

To keep the bodies of the first p-channel transistor 70 and the first n-channel transistor 72 from floating, and referring to FIG. 4, a p-channel transistor 70 and an n-channel transistor 72 may be added. The source and body of p-channel transistor 70 are coupled to the Vdd supply 60 of the output buffer. The drain of p-channel transistor 70 is coupled to the body of the first p-channel transistor 52. The gate of p-channel transistor 70 is coupled to the input terminal of the output buffer. Likewise, the source and body of n-channel transistor 72 are coupled to the ground terminal 66 of the output buffer. The drain of n-channel transistor 72 is coupled to the body of the first n-channel transistor 54, and the gate of n-channel transistor 72 is coupled to the input terminal 62 of the output buffer.

In most output buffer applications, the width of n-channel transistor 72 and p-channel transistor 70 can be small relative to p-channel transistor 56 and n-channel transistor 58, respectively, as they only need to overcome the expected photo current induced by a dose rate or SEU event. Thus, the performance impact of adding n-channel transistor 72 and p-channel transistor 70 may be relatively small. The capacitors 90 and 92 in FIG. 4 represent the parasitic capacitance to Vdd and ground, respectively, that normally exist in any circuit.

Another change relative to FIG. 3 is that inverter 64 of FIG. 3 has been replaced with a first inverter 80 and a second inverter 82. The first inverter 80 drives the gate of the first n-channel transistor 54, and the second inverter 82 drives the gate of the first p-channel transistor 52. It is recognized that separate inverters are not required to realize the benefits of n-channel transistor 72 and p-channel transistor 70. However, they are shown as an alternative embodiment to the output buffer of FIG. 3.

During an ESD event, the output terminal Vout 68 of FIG. 4 is driven either high or low by the ESD event. If the output buffer is not powered during the ESD event (e.g., Vdd=0), then all of the terminals are floating near zero volts. For the purpose of illustration, a positive ESD event between Vout and Ground is discussed. The discussion for a negative voltage ESD event would be similar, but with the n-channel and p-channel transistors changing roles.

As Vout 68 is driven positive, p-channel transistor 56 turns on because its gate is at about 0V. This allows current to flow to the body terminal of the first n-channel transistor 54, turning on the parasitic lateral bipolar transistor of the first n-channel transistor 54. This allows some current to flow from Vout 68 to ground 66 through the first n-channel transistor 54. However, in a transistor that is optimized for maximum snapback voltage, the bipolar gain is typically small, often less than one. Therefore, while some current may be conducted through the first n-channel transistor 54, it may not be enough to provide adequate ESD protection.

Likewise, since the gate and source terminal of the first p-channel transistor are at about zero volts, the first p-channel transistor 52 may turn on as Vout 68 is driven high. The first p-channel transistor 52 may thus sink current from Vout 68 to the Vdd supply 60, which may power up the chip relative to ground. The effective capacitance of the Vdd supply 60 may be relatively large, and as such, may be able to absorb some of the energy from the ESD event. However, to depend upon the effective capacitance of the Vdd supply 60 as the primary source of ESD protection may be undesirable for some applications.

Figure 5:
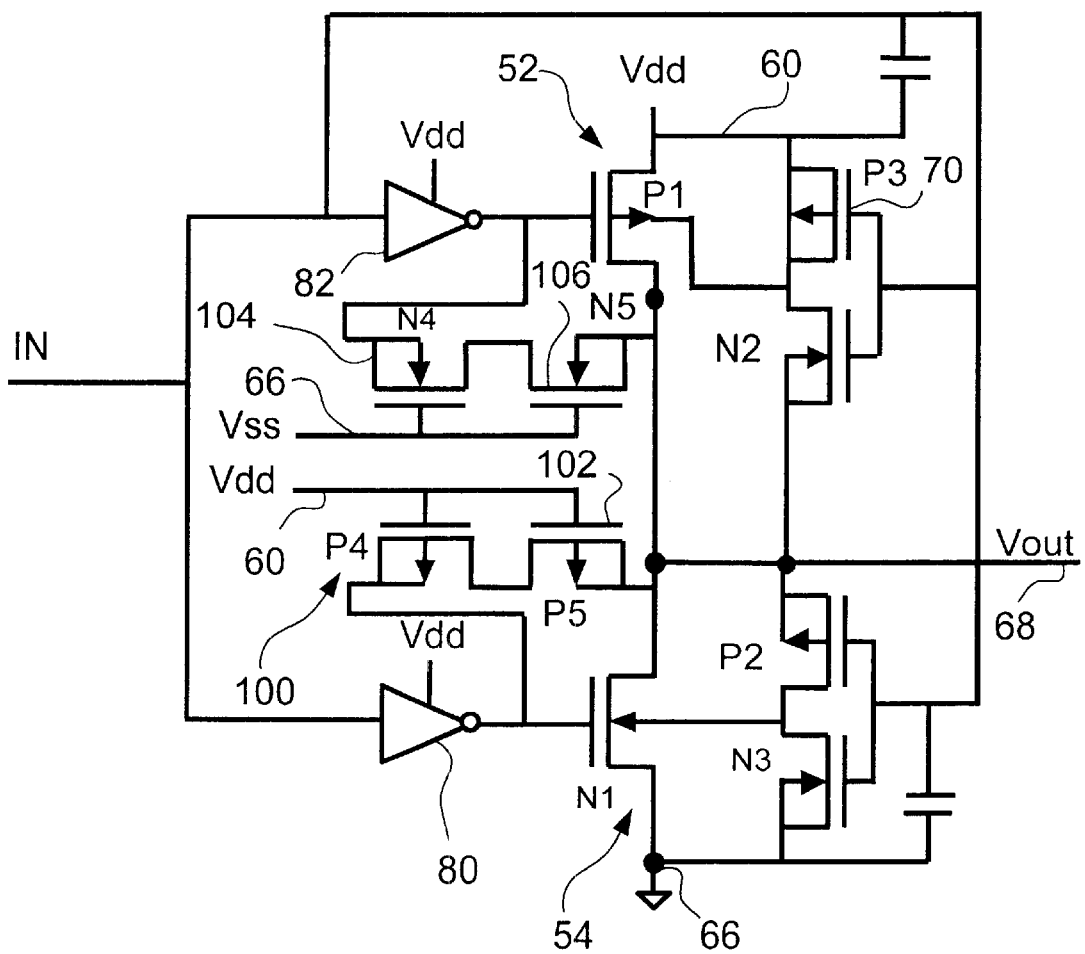
FIG. 5 is a schematic diagram of an illustrative high performance SOI driver with enhanced ESD protection.

An illustrative way to enhance the ESD protection for the output buffer of FIG. 4 is shown in FIG. 5. A first coupling circuit is provided for coupling the gate of the first n-channel transistor 54 to Vout 68 when the voltage at Vout 68 exceeds the voltage at the Vdd supply 60 by a predetermined amount. A second coupling circuit may also be provided for coupling the gate of the first p-channel transistor 52 to Vout 68 when the voltage at Vout 68 drops below the voltage at the Vss supply 60 by a predetermined amount.

The first coupling circuit preferably includes two back-to-back p-channel transistors 100 and 102 connected between the gate of the first n-channel transistor 54 and Vout 68. The source and body of p-channel transistor 100 are coupled to the gate of the first n-channel transistor 54. The gate of p-channel transistor 100 is coupled to the Vdd supply 60. The source and body of p-channel transistor 102 are coupled to Vout 68. The drain of p-channel transistor 102 is coupled to the drain of p-channel transistor 100. Finally, the gate of p-channel transistor 102 is coupled to the Vdd supply 60.

Transistors 100 and 102 allow Vout 68 to feed forward into the gate of the first n-channel transistor 54 when Vout 68 rises above the Vdd supply 60. Since the gates of transistors 100 and 102 are tied to the Vdd supply 60, they turn on when Vout 68 rises something over a transistor threshold above the Vdd supply 60. Back-to-back transistors are preferred so that the gate of the first n-channel transistor 54 remains isolated from Vout 68 when Vout 68 is lower than the gate voltage.

Transistors 100 and 102 permit the first n-channel transistor 54 to turn on to it's maximum drive current because the gate and body of the first n-channel transistor 54 are effectively connected to Vout 68, thus lowering the threshold voltage and maximizing bipolar current. An additional benefit is that the voltages between the gate, body and drain terminals of the first n-channel transistor 54 are minimized, thereby maximizing the voltage that can be applied by Vout without causing destructive breakdown phenomena.

Adding transistors 100 and 102 provides a major improvement in ESD protection. However, it is recognized that as the gate of the first n-channel transistor 54 is driven above the Vdd Supply 60, the p-channel transistor 130 of inverter 80 (see FIG. 6) may provide a forward biased diode to the Vdd supply 60. This may limit the gate voltage that can be applied to the first n-channel transistor 54, and may charge up the Vdd supply 60. While this may be beneficial for preventing gate-to-source breakdown, it reduces the potential maximum drive of the first n-channel transistor 54 during an ESD event.

The second coupling circuit shown in FIG. 5 may include two back-to-back n-channel transistors 104 and 106 connected between the gate of the first p-channel transistor 52 and Vout 68. The source and body of n-channel transistor 104 are coupled to the gate of the first p-channel transistor 52. The gate of n-channel transistor 104 is coupled to the Vss supply 66. The source and body of n-channel transistor 106 are coupled to Vout 68. The drain of n-channel transistor 106 is coupled to the drain of n-channel transistor 104. Finally, the gate of n-channel transistor 106 is coupled to the Vss supply 66.

Like above, transistors 104 and 106 allow Vout 68 to feed forward into the gate of the first p-channel transistor 52 when Vout 66 drops below Vss (ground) 66. Since the gates of transistors 104 and 106 are tied to Vss 66, they turn on when Vout 68 drops something more than a transistor threshold below Vss 66. Back-to-back transistors are preferred so that the gate of the first p-channel transistor 24 remains isolated from Vout 68 when Vout 68 is higher than the gate voltage.

Transistors 104 and 106 permit the first p-channel transistor 52 to turn on to it's maximum drive current because the gate and body of the first p-channel transistor 52 are effectively connected to Vout 68, thus lowering the threshold voltage and maximizing bipolar current. An additional benefit is that the voltages between the gate, body and drain terminals of the first p-channel transistor 52 are minimized, thereby maximizing the voltage that can be applied by Vout without causing destructive breakdown phenomena.

Adding transistors 104 and 106 provides a major improvement in ESD protection. However, it is recognized that as the gate of the first p-channel transistor 52 is driven below the Vss Supply 66, the n-channel transistor of inverter 82 (see FIG. 6) may provide a forward biased diode from the Vss supply 66. This may limit the gate voltage that can be applied to the first p-channel transistor 52, and may reduce the potential maximum drive of the first p-channel transistor 52 during an ESD event.

As indicated above, when an ESD event drives Vout 68 higher than Vdd, the first p-channel transistor 52 will likely turn on. This provides a current path between Vout 68 and Vdd. Depending upon the frequency and duration of the ESD event, this may actually power up the circuit biasing the output buffer input terminal (IN) 62 to a state that may reduce the effectiveness of the protection circuit.

Figure 6:
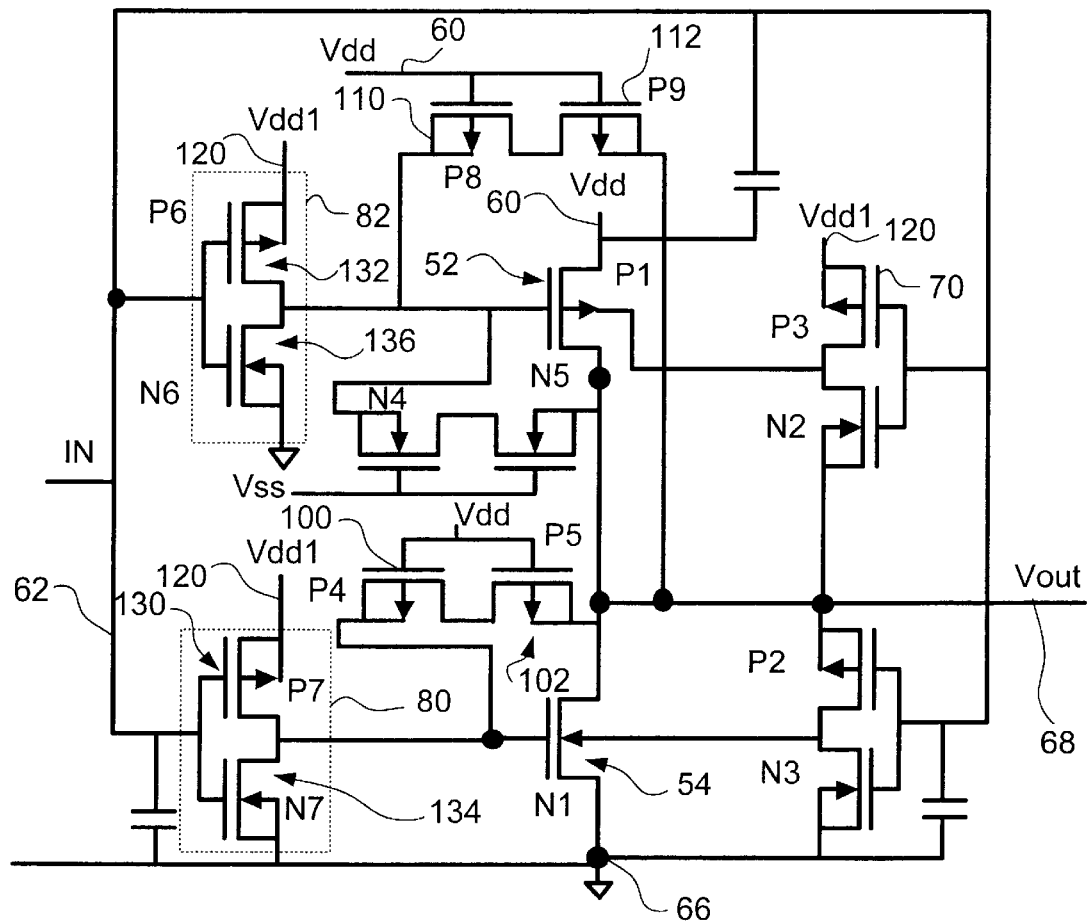
FIG. 6 is a schematic diagram of another illustrative high performance SOI driver with enhanced ESD protection.
Figure 7:
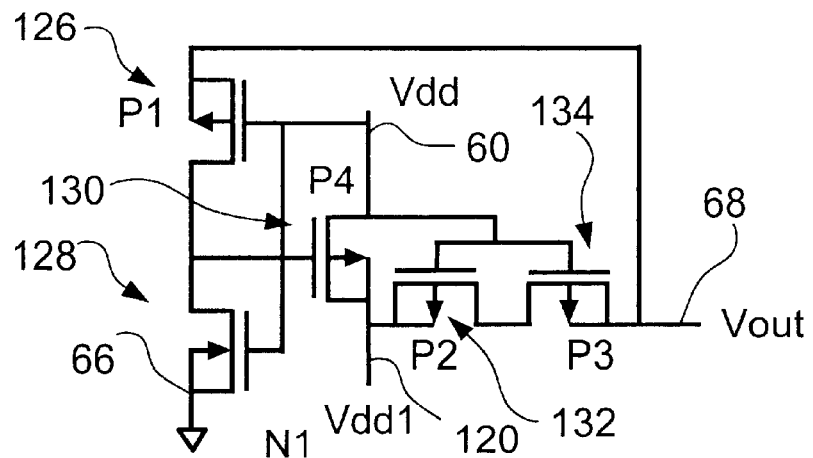
FIG. 7 is a schematic diagram of a first illustrative Vdd1 power supply circuit for providing enhanced ESD protection.
Figure 8:
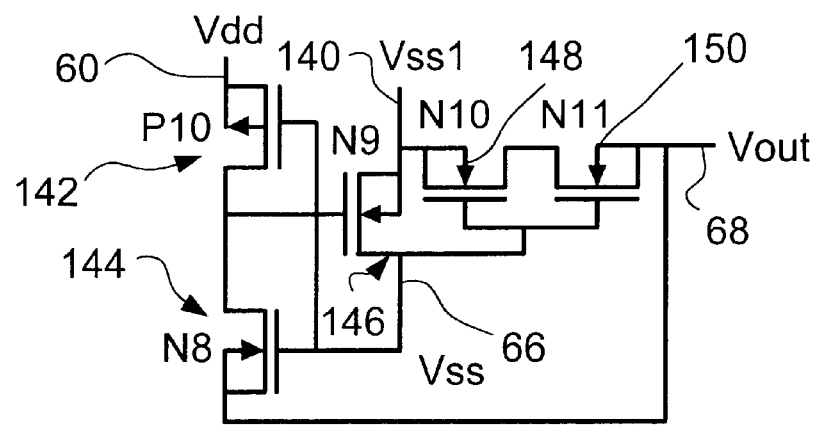
FIG. 8 is a schematic diagram of a first illustrative Vss1 power supply circuit for providing enhanced ESD protection.

FIGS. 6–8 describes a circuit that prevents feedback of Vout 68 into Vdd during a positive ESD event. Back-to-back p-channel transistors 110 and 112 are added to enable Vout 68 to feed into the gate of the first p-channel transistor 52 when Vout 68 is a threshold above the Vdd supply 60. This may help prevent the first p-channel transistor 52 from turning on and providing a conduction path between Vout 68 and the Vdd supply 60.

Instead of the back-to-back p-channel transistors 110 and 112, or in addition to, it is contemplated that a Vdd1 power supply circuit may be provided. The Vdd1 power supply circuit may connect the gate of the first p-channel transistor to Vout 68 when Vout 68 rises above the Vdd supply 60. An illustrative Vdd1 power supply circuit is shown in FIG. 7. The Vdd1 power supply circuit of FIG. 7 includes a Vdd1 power supply output terminal 120 that is connected to the power supply terminals of buffer 80, buffer 82 and transistor 70 as shown. The Vdd1 power supply circuit connects the Vdd supply 60 to the Vdd1 power supply output terminal 120 when the Vdd supply 60 is greater than Vout 68, and connects the Vdd1 power supply output terminal 120 to Vout 68 when Vout 68 is greater than the Vdd supply 60. Furthermore, the Vdd1 power supply circuit isolates the Vdd Supply 60 from Vout 68 when the Vdd supply 60 is less than Vout 68, thus preventing any feedback of Vout 68 into the Vdd Supply 60.

Referring specifically to FIG. 7, the illustrative Vdd1 power supply circuit includes p-channel transistor 126, n-channel transistor 128, p-channel transistor 130, p-channel transistor 132 and p-channel transistor 134. The source and body of p-channel transistor 126 are coupled to Vout 68, and the gate of p-channel transistor 126 is coupled to the Vdd supply 60. The source and body of n-channel transistor 128 are coupled to ground. The drain of n-channel transistor 128 is coupled to the drain of p-channel transistor 126, and the gate of n-channel transistor 128 is coupled to the Vdd Supply 60.

The source and body of p-channel transistor 130 are coupled to the Vdd1 power supply output terminal 120. The drain of p-channel transistor 130 is coupled to the Vdd supply 60, and the gate of p-channel transistor 130 is coupled to the drain of p-channel transistor 126 and the drain of n-channel transistor 128.

The source and body of p-channel transistor 132 are coupled to the Vdd1 power supply output terminal 120. The gate of p-channel transistor 132 is coupled to the Vdd supply 60. Finally, the source and body of p-channel transistor 134 are coupled to Vout 68. The drain of p-channel transistor 134 is coupled to the drain of p-channel transistor 132, and the gate of p-channel transistor 134 is coupled to the Vdd supply 60.

During a positive ESD event, Vout 68 rises above the Vdd supply 60. When the integrated circuit is not powered up, the Vdd supply 60 is floating near ground, thereby turning off n-channel transistor 128. If Vout 68 is greater than a p-channel threshold above the Vdd supply 60, p-channel transistors 132 and 134 turn on, coupling Vout 68 to the Vdd1 power supply output terminal 120. This enables the Vdd1 power supply output terminal 120 to rise with Vout 68. P-channel transistor 126 also turns on, shorting Vout 68 to the gate of p-channel transistor 130, which turns p-channel transistor 130 off to isolate the Vdd supply 60 from Vout 68.

Under normal circuit operation, the Vdd supply 60 is high, turning p-channel transistor 126 off and n-channel transistor 128 on, thereby grounding the gate of p-channel transistor 130. P-channel transistor 130 is connected so as to form a diode from the Vdd supply 60 to the Vdd1 power supply output terminal 120 even when the gate is high. However, driving the gate low turns on p-channel transistor 130, shorting the Vdd supply 60 to the Vdd1 power supply output terminal 120. The width of p-channel transistor 130 is preferably chosen to be large enough to have no detrimental effect on the normal operation of the circuit in FIG. 6. P-channel transistors 132 and 134 are off since their gates are at Vdd, disconnecting them from Vout 68.

During an ESD event when the circuit is powered up, it is sometimes desirable to prevent the gate of the first p-channel transistor 52 of FIG. 6 from following Vout 68, which prevents the first p-channel transistor 52 from turning on and sinking ESD energy to the Vdd supply 60. The drive ratios between p-channel transistor 126 and n-channel transistors 128 determine how much of Vout 68 is fed to the gate of p-channel transistor 130 to turn it off. In some cases, it is desirable to leave p-channel transistor 130 on so as to keep the Vdd1 power supply output terminal 120 near Vdd to maximize the ESD immunity of the circuit of FIG. 6. In other cases, it is desirable to maintain full isolation to the Vdd supply 60. In these later cases, the drive ratio between p-channel transistor 126 and n-channel transistor 128 can be adjusted to force p-channel transistor 130 to turn off.

It is recognized that p-channel transistors 100, 102, 110 and 112 may no longer be needed when the Vdd supply 60 is not powered up because as Vout 68 rises above the Vdd supply 60, the Vdd1 power supply output terminal 120 charges up the output nodes of the inverters 80 and 82 to Vout 68 through p-channel device 130 and 132, respectively. However, when the Vdd supply 60 is powered up, the additional p-channel transistors 100, 102, 110 and 112 may be desirable to overdrive the n-channel transistors 134 and 136.

For the powered up case where the Vdd supply 60 is not floating, it is recognized that allowing the first p-channel 52 of FIG. 6 to turn on may actually provide additional ESD immunity by conducting current to the Vdd supply 60 through the first p-channel transistor 52 (as well as to ground 66 through the first n-channel transistor 54). The overall greatest immunity may result from leaving p-channel transistors 100 and 102 in the circuit to drive the gate of the first n-channel transistor 54 high, while removing p-channel transistors 110 and 112 so that the gate of the first p-channel transistor is kept fairly low by n-channel transistor 136 of inverter 82.

The above discussion assumes that terminal IN 62 of FIG. 6 remains near ground when the chip is not powered up. Keeping Vout 68 from charging up the Vdd supply 60 should keep IN 62 to less than one diode drop above the Vdd supply 60, even if Vout 68 is able to capacitively couple into the IN node 62. This could turn on n-channel transistors 134 and 136 slightly. It is expected that the voltage coupled into IN 62 from Vout 68 will be no higher than the minimum of Vout/2 or a diode drop. Depending upon the inverter design, p-channel transistors 130 and 132 should be able to overdrive n-channel transistors 134 and 136. If necessary, however, p-channel transistors 110 and 112 can be included in the circuit along with p-channel transistors 100 and 102 at device widths that are sufficient to overdrive n-channel transistors 134 and 136.

Figure 9:
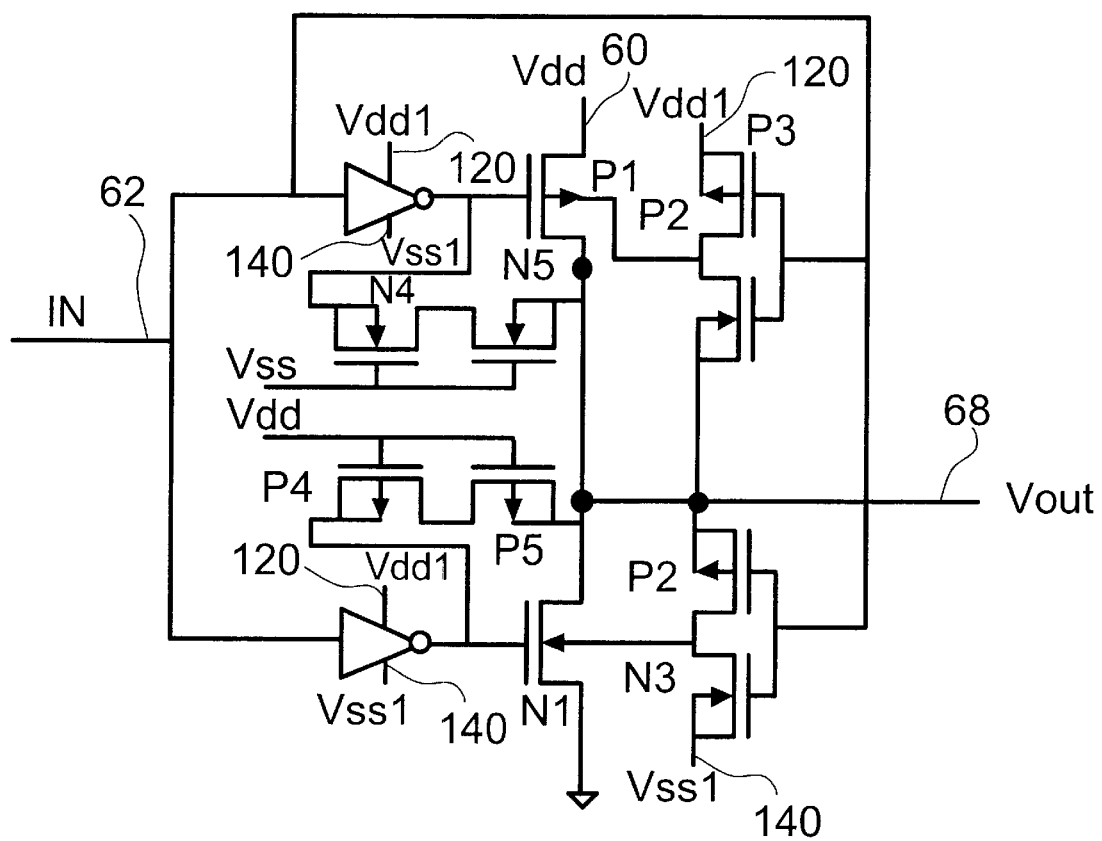
FIG. 9 is a schematic diagram of yet another illustrative high performance SOI driver with enhanced ESD protection.

FIG. 9 is similar to FIG. 6 but further includes a Vss1 power supply circuit. The Vss1 power supply circuit helps provide ESD protection for negative going ESD events. Referring to FIG. 8, the Vss1 power supply circuit preferably includes a Vss1 power supply terminal 140. The Vss1 power supply circuit may connect Vss 66 (see FIG. 6) to the Vss1 power supply terminal 140 when Vout 68 is above Vss 66. The Vss1 power supply circuit may also connect Vout to the Vss1 power supply terminal 140 when Vout drops below Vss 66 by a predetermined amount.

The illustrative Vss1 power supply circuit includes a p-channel transistor 142, an n-channel transistor 144, an n-channel transistor 146, an n-channel transistor 148 and an n-channel transistor 150. The source and body of p-channel transistor 142 are coupled to the Vdd supply 60. The gate of p-channel transistor 142 is coupled to the ground terminal 66. The source and body of n-channel transistor 144 are coupled to Vout 68. The drain of n-channel transistor 144 is coupled to the drain of p-channel transistor 142, and the gate n-channel transistor 144 is coupled to the ground terminal 66.

The source and body of n-channel transistor 146 are coupled to the Vss1 power supply terminal 140 of the Vss1 power supply circuit. The drain of n-channel transistor 146 is coupled to the ground terminal 66. The gate of n-channel transistor 146 is coupled to the drain of p-channel transistor 142 and the drain of n-channel transistor 144.

The source and body of n-channel transistor 148 are coupled to the Vss1 power supply terminal 140 of the Vss1 power supply circuit. The gate of n-channel transistor 148 is coupled to the ground terminal 66 of the CMOS buffer. Finally, the source and body of n-channel transistor 150 are coupled to Vout 68. The drain of n-channel transistor 150 is coupled to the drain of n-channel transistor 148, and the gate of n-channel transistor 150 is coupled to the ground terminal 66 of the CMOS buffer.

During a negative ESD event, Vout 68 drops below ground 66. When the integrated circuit is not powered up, the Vdd supply 60 floats near ground, turning off p-channel transistor 142. If Vout 68 drops more than a n-channel threshold below Vss 66, n-channel transistors 148 and 150 turn on, coupling Vout 68 into the Vss1 power supply terminal 140. This enables the Vss1 power supply terminal 140 to fall with decreasing Vout 68. N-channel transistor 144 also turns on, shorting Vout 68 to the gate of n-channel transistor 146, which turns n-channel transistor 146 off to isolate the ground terminal 66 from Vout 68.

Under normal circuit operation, the Vdd supply 60 is high, turning p-channel transistor 142 on and n-channel transistor 144 off, forcing the gate of n-channel transistor 146 high. N-channel transistor 146 is connected so as to form a diode from the ground terminal 66 to the Vss1 power supply output terminal 140 even if the gate is low. However, driving the gate high turns on n-channel transistor 146, shorting Vss 66 to the Vss1 power supply terminal 140. The width of n-channel transistor 146 is preferably chosen to be large enough to have no detrimental effect on the normal operation of the circuit in FIG. 9. N-channel transistors 148 and 150 are off since their gates are at ground, disconnecting them from Vout 68.

Figure 10:
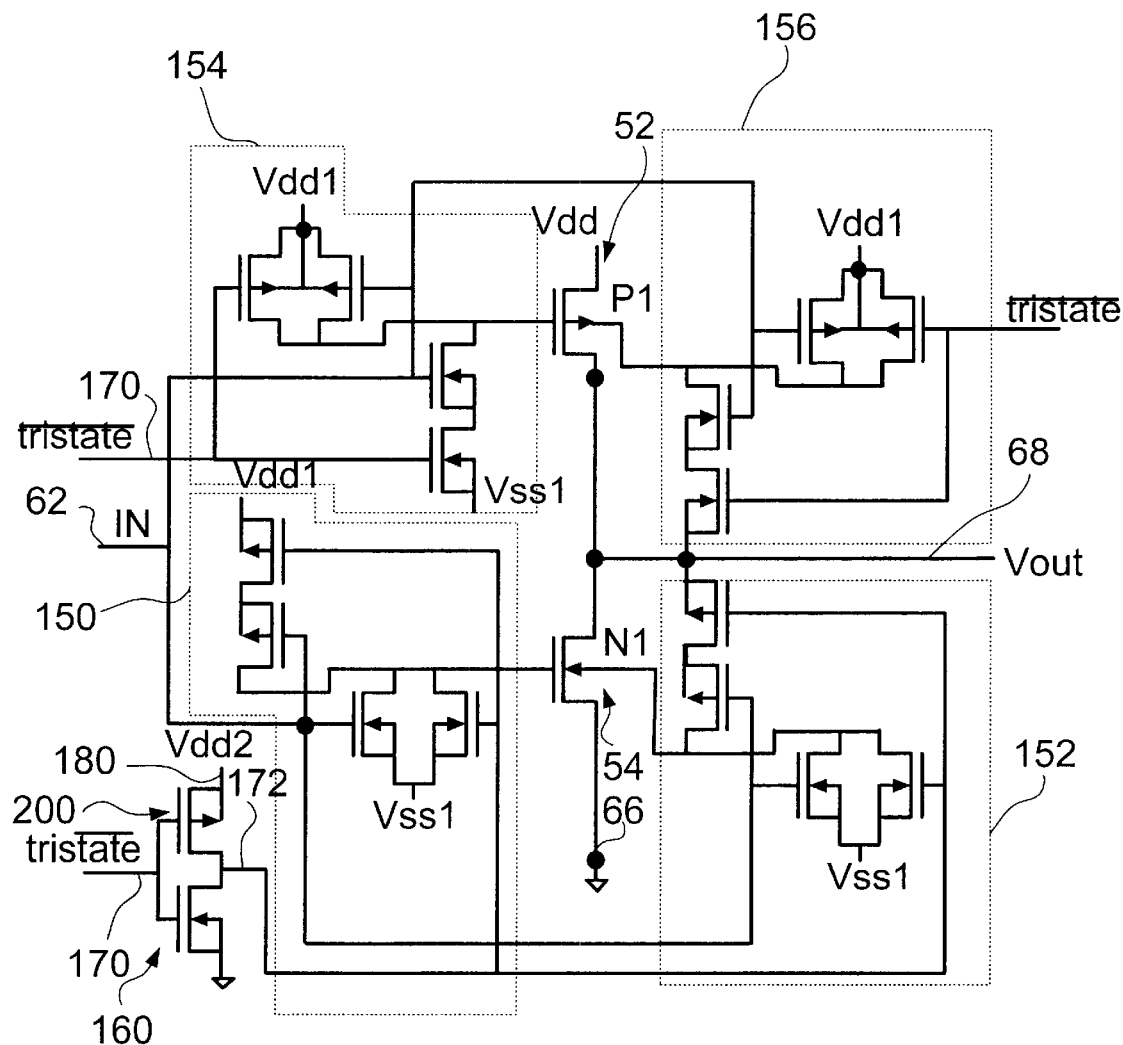
FIG. 10 is a schematic diagram of an illustrative high performance tri-stateable SOI driver with and enhanced ESD protection for cold spare applications.

FIG. 10 is a schematic diagram of an illustrative high performance tri-stateable SOI driver with and enhanced ESD protection for cold spare applications. For cold spare applications, the output buffer is typically connected to a data bus with the power to Vdd turned off until the chip is needed to replace another as a "spare". A typical requirement is that the I/O pins must be able to handle the application of the signals traversing the bus without causing excessive loading on the bus or interfering with the data being transmitted.

A circuit configuration for cold spare applications is shown in FIG. 10. This output buffer circuit has a "tri-state" output that cause the output buffer to go into high impedance state when not in use (e.g., tristate_bar=low). FIG. 10 is derived from FIG. 9 by substituting NOR gates 150 and 152 for the inverters connected to the first n-channel transistor 54 (both gate and body), and NAND gates 154 and 156 for the inverters connected to the first p-channel transistor 52 (both gate and body). An additional tri-state inverter 160 is used to generate the tri-state signal from tristate_bar. For this particular circuit, transistors 100, 102, 104 and 106 have been left out to demonstrate that their function can be accomplished by Vdd1 and Vss1, but can be included if desired.

For cold spare applications, it is desirable to have both the first p-channel transistor 52 and the first n-channel transistor 54 in an off state when Vout 68 is less than the specified maximum output bus voltage (Vddbmax). As long as signal IN 62 or tristate_bar 170 are low, as they would normally be in the powered down mode, the Vdd1 circuit will pull the gate and body of the first p-channel transistor 52 high with Vout, thereby keeping the first p-channel transistor 52 off and preventing any significant currents between Vout and the Vdd supply 60. However, in order to keep the first n-channel transistor 54 off, the tri-state signal 172 must rise with Vout 68 to keep the gate and body of the first n-channel transistor 52 near ground. This is preferably accomplished by connecting the tri-state inverter 160 to the Vdd2 power supply circuit. An illustrative Vdd2 generator is shown in FIG. 11.

Figure 11:
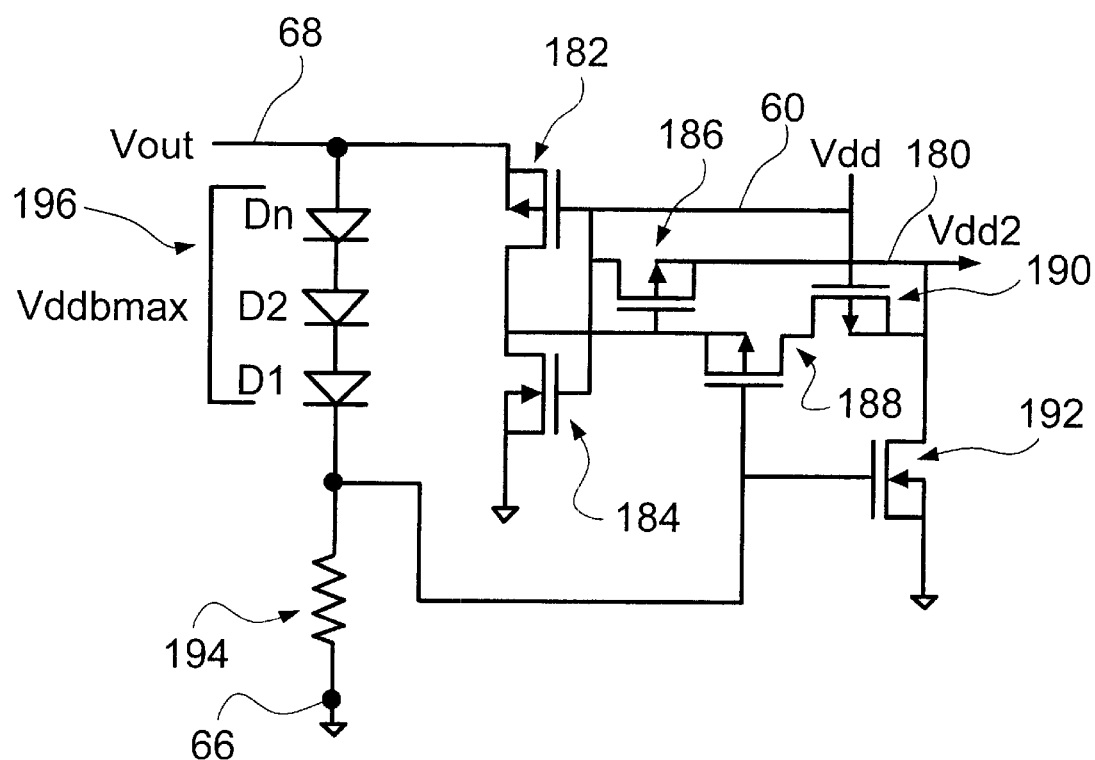
FIG. 11 is a schematic diagram of a second illustrative Vdd2 power supply circuit similar to that shown in FIG. 7 but optimized for cold spare applications.

The Vdd2 power supply circuit shown in FIG. 11 has a Vdd2 power supply terminal 180. The Vdd2 power supply circuit connects the Vdd2 power supply terminal 180 to the Vdd supply 60 when Vout is below the Vdd supply 60. The Vdd2 power supply circuit also connects the Vdd2 power supply terminal 180 to Vout when Vout is below a predetermined maximum value but above the Vdd supply 60. Finally, the Vdd2 power supply circuit connects the Vdd2 power supply terminal 180 to the ground terminal 66 when Vout is above a predetermined maximum value (Vddbmax).

Referring specifically to FIG. 11, the illustrative Vdd2 power supply circuit includes four p-channel transistors 182, 186, 188 and 190, two n-channel transistors 184 and 192, a resistor 194 and a number of diodes 196. The source and body of p-channel transistor 182 are coupled to Vout 68, and the gate of p-channel transistor 182 is coupled to the Vdd supply 60.

The source and body of n-channel transistor 184 are coupled to ground 66. The gate of n-channel transistor 184 is coupled to the Vdd supply 60, and the drain of n-channel transistor 184 is coupled to the drain of p-channel transistor 182. The source and body of p-channel transistor 186 are coupled to the Vdd2 power supply terminal 180, the drain of p-channel transistor 186 is coupled to the Vdd supply 60, and the gate of p-channel transistor 186 is coupled to the drain of n-channel transistor 184 and the drain of p-channel transistor 182. The source and body of p-channel transistor 188 are coupled to the drain of the n-channel transistor 184 and the drain of p-channel transistor 182.

The source and body of p-channel transistor 190 are coupled to the Vdd2 power supply terminal 180, the drain of p-channel transistor 190 is coupled to the drain of p-channel transistor 188, and the gate of p-channel transistor 190 is coupled to the Vdd supply 60.

The source and body of n-channel transistor 192 are coupled to ground 66. The drain of n-channel transistor 192 is coupled to the Vdd2 power supply terminal 180, and the gate of n-channel transistor 192 is coupled to gate of p-channel transistor 188

A first terminal of the resistor 194 is coupled to ground 66. The number of diodes 196 are connected in a series configuration between Vout 68 and the second terminal of the resistor 194. Finally, the gate of n-channel transistor 192 and the gate of the p-channel transistor 188 are coupled to the first terminal of the resistor 194 as shown. It is contemplated that resistor 194 may be formed in the sea-of-transistors or sea-of-gates region of the integrated circuit by using the sub-channel resistance of the body of a transistor as disclosed in U.S. patent application Ser. No. 09/219,804, filed Dec. 23, 1998, and entitled "INTEGRATED CIRCUIT IMPEDANCE DEVICE AND METHOD OF MANUFACTUR THEREFOR, which is incorporated herein by reference.

In cold spare mode, (the Vdd supply 60 is low), and when Vout is more than a p-channel threshold above Vdd and ground, p-channel transistors 182, 188 and 190 are turned on and n-channel transistors 184 and 192 are off shorting Vout 68 to the Vdd2 power supply terminal 180. As long as Vout is less than the series voltage drop across the diode string 196 (e.g., Vddbmax), the gate of n-channel transistor 192 remains grounded through resistor 194.

When Vout exceeds Vddbmax+Vtn, the voltage across the resistor 194 turns on n-channel transistor 192 and limits the current through p-channel transistor 188. Assuming the drive of n-channel transistor 192 is much larger than p-channel transistors 182, 188 and 190 in series, the Vdd2 power supply terminal 180 will be pulled to ground. Since the tri-state signal 172 (see FIG. 10) no longer follows Vout 68, but rather is forced to ground through the forward biased diode of p-channel transistor 200 of tri-state inverter 160 of FIG. 10, the gate and body terminals of the first n-channel transistor 54 become coupled to Vout 68 through the Vdd1 power supply circuit on NOR gate 150 and the Vdd terminal of NOR gate 152, thereby turning the first n-channel transistor 54 on to provide the desired conduction of the ESD current to ground 66. The Vddbmax voltage drop is easily set by varying the number of diodes and/or transistors connected as diodes to achieve the desired maximum buss voltage allowed before initiation of ESD protection.

It is common to invoke cold sparing by simply disconnecting Vdd to the chip and assuming it will discharge to ground. Normally this should occur quickly. However, as Vdd discharges, the chip is in a state where n-channel transistor 184 is on and p-channel transistor 182 is on, thus presenting a load to Vout 68. While this may not be a large load for Vout 68, it is mentioned here for completeness. To minimize the load on Vout 68, the width of n-channel transistor 184 should be made small or a resistive element may also be placed in series with the source of n-channel transistor 184 to limit the current during the transition period as Vdd discharges toward ground. This comment also applies to the n-channel transistor 128 of FIG. 7.

Figure 12:
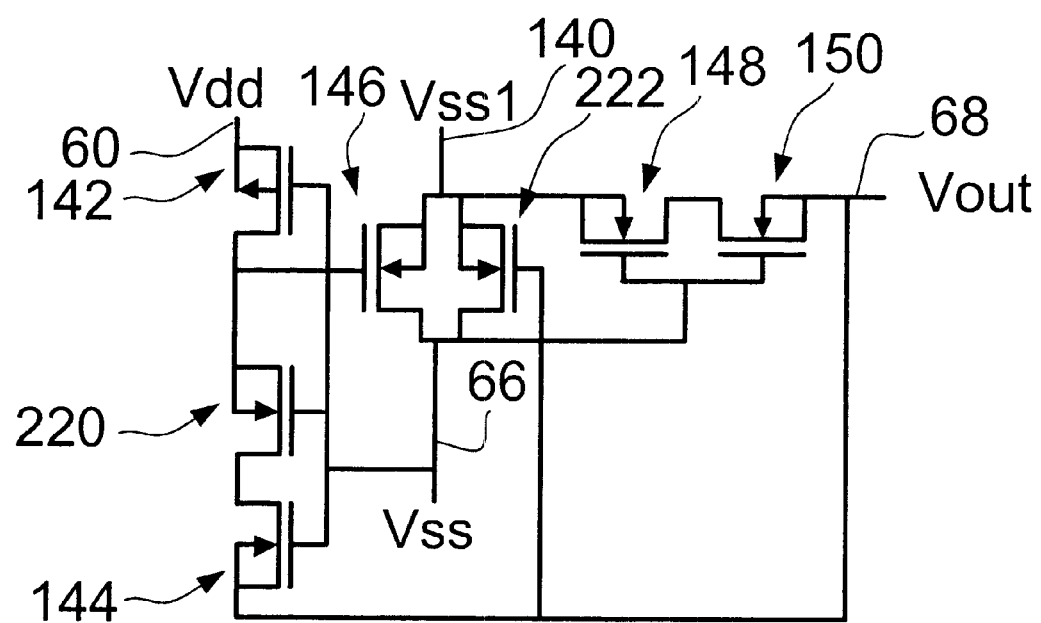
FIG. 12 is a schematic diagram of an illustrative Vss2 power supply circuit similar to that shown in FIG. 8 but optimized for cold spare applications.

FIG. 12 is a schematic diagram of an illustrative Vss1 power supply circuit similar to that shown in FIG. 8 but optimized for cold spare applications. To minimize the loading on Vout 68 for cold spare applications, additions to the Vss1 power supply circuit of FIG. 8 may be desirable. Use of the Vss1 power supply circuit shown in FIG. 8 when Vout 68 is greater than the Vdd supply 60 may actually forward bias the p-well to drain diode of n-channel transistor 144 and the drain to N-well diode of p-channel transistor 142. While this is not a major issue for pure ESD protection, it may present a significant load for cold spare applications with buss voltages higher than 2 forward diode drops (~1.2V). The Vss1 power supply circuit shown in FIG. 12 eliminates this path by inserting n-channel transistor 220, which is always off when Vout 68 is greater than Vss (ground) 66.

If the Vdd supply 60 is near ground, n-channel transistor 146 is also off. However, while the Vss1 power supply terminal 140 is limited to no more than a diode drop above Vss (ground) 66, this may not be sufficient to ensure that the first n-channel transistor 54 of FIG. 10 remains off. Therefore n-channel transistor 222 is added to help make sure the Vss1 power supply terminal 140 is grounded if Vout 68 is greater than Vss+Vtn.

Figure 13:
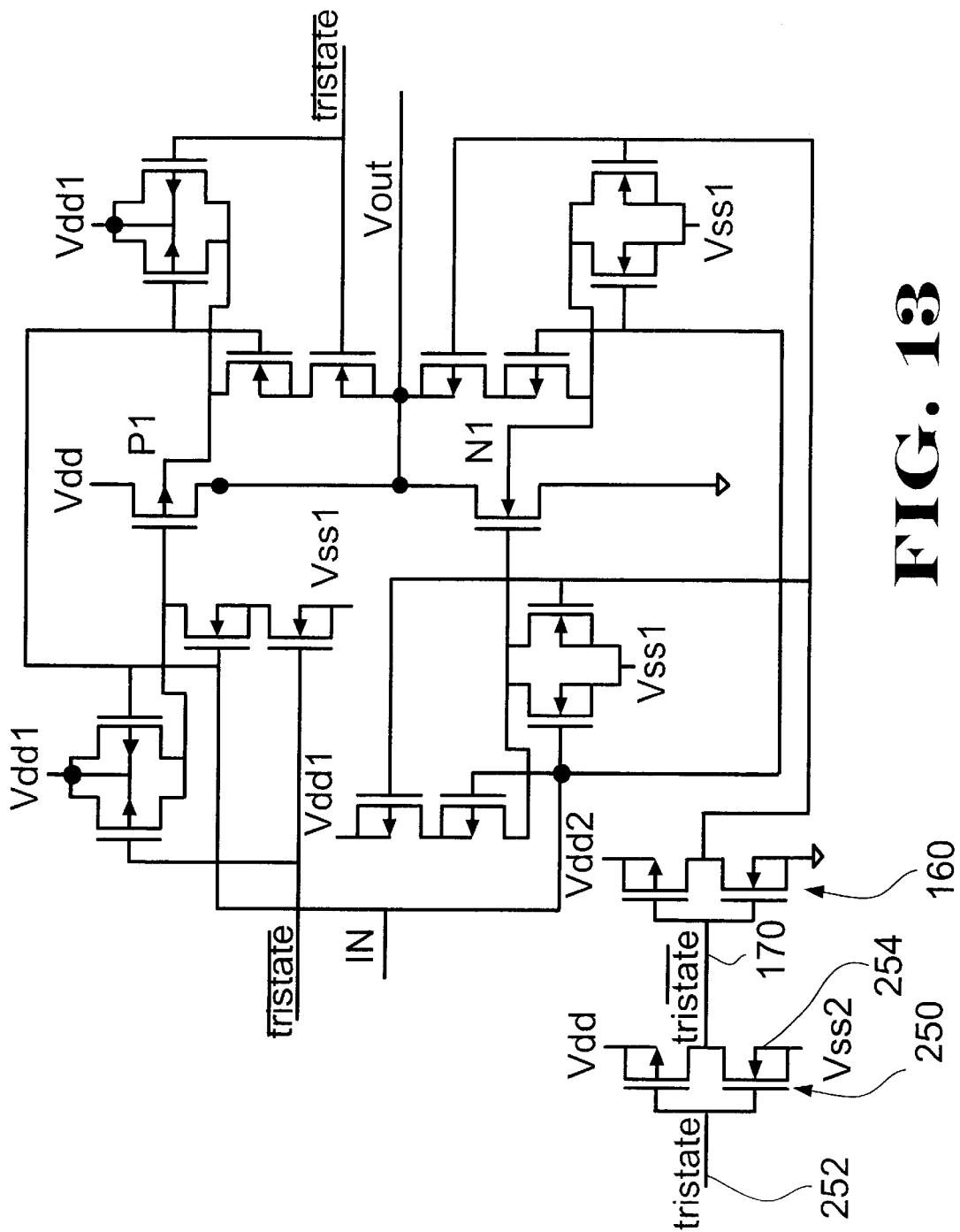
FIG. 13 is a schematic diagram of another illustrative high performance tri-stateable SOI driver with and enhanced ESD protection for cold spare applications.
Figure 14:
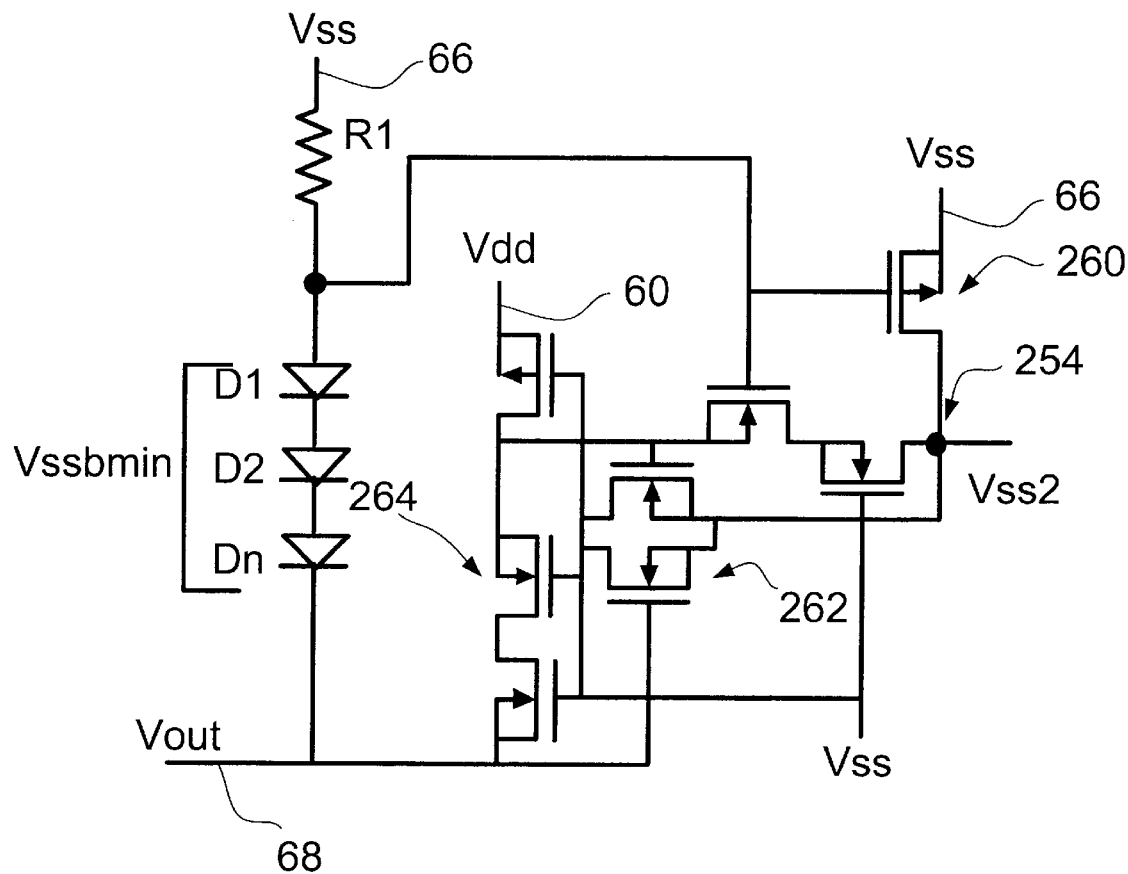
FIG. 14 is a schematic diagram of another illustrative Vss2 power supply circuit for providing enhanced ESD protection for the SOI driver of FIG. 13.

Another application where the circuit concepts described above are applicable is when the bus has a signal that goes below Vss. In this case, it is desirable to allow Vout 68 to go below Vss without introducing additional loading. An output buffer for such an application is shown in FIG. 13. The output buffer of FIG. 13 is identical to that shown in FIG. 10 except an additional tri-state inverter 250 is provided between tri-state inverter 160 and a tri-state input terminal 252. The Vss terminal 254 of the tri-state inverter 250 is connected to a Vss2 power supply circuit as best shown in FIG. 14.

The Vss2 power supply circuit is similar to the Vdd2 power supply circuit shown and described with reference to FIG. 11 above. The Vss2 power supply circuit causes the Vss2 power supply terminal 254 to follow Vout 68 below Vss 66 until it becomes more negative than Vssbmin-Vtp. At this time, p-channel transistor 260 turns on, shorting the Vss2 power supply terminal 254 back to Vss 66, and invoking the ESD protection. N-channel transistors 262 and 264 are added for the same reasons they were added to the Vss1 power supply circuit of FIG. 12. Similar transistors can be added to the Vdd1 and Vdd2 power supply circuits shown in FIGS. 7 and 11 to perform the same function if desired.

Having thus described the preferred embodiments of the present invention, those of skill in the art will readily appreciate that the teachings found herein may be applied to yet other embodiments within the scope of the claims hereto attached.

What is claimed is:

1. A CMOS buffer having a power supply terminal, a ground terminal, an input terminal and an output terminal, the CMOS buffer comprising:

a first p-channel transistor having a source, a drain, a gate, and a body, the source of the first p-channel transistor is coupled to the power supply terminal, the gate of the first p-channel transistor is controlled by the input terminal of the CMOS buffer;

a first n-channel transistor having a source, a drain, a gate, and a body, the source of the first n-channel transistor is coupled to the ground terminal of the CMOS buffer, the gate of the first n-channel transistor is controlled by the input terminal of the CMOS buffer, and the drain of the first n-channel transistor is coupled to the drain of the first p-channel transistor and further coupled to the output terminal of the CMOS buffer;

first coupling means for coupling the body of the first p-channel transistor to the output terminal of the CMOS buffer when the gate of the first p-channel transistor is low, and for coupling the body of the first p-channel transistor to the power supply terminal of the CMOS buffer when the gate of the first p-channel transistor is high; and second coupling means for coupling the body of the first n-channel transistor to the output terminal of the CMOS buffer when the gate of the first n-channel transistor is high, and for coupling the body of the first n-channel transistor to the ground terminal of the CMOS buffer when the gate of the first n-channel transistor is low.

2. A CMOS buffer according to claim 1, wherein said first coupling means comprises:

a second p-channel transistor having a source, a drain, a gate, and a body, the source and body of the second p-channel transistor are coupled to the power supply terminal of the CMOS buffer, the drain of the second p-channel transistor is coupled to the body of the first p-channel transistor, and the gate of the second p-channel transistor is coupled to the input terminal of the CMOS buffer; and a second n-channel transistor having a source, a drain, a gate, and a body, the source of the second n-channel transistor is coupled to the body of the first p-channel transistor, the body and drain of the second n-channel transistor are coupled to the output terminal of the CMOS buffer, and the gate of the second n-channel transistor is coupled to the input terminal of the CMOS buffer.

3. A CMOS buffer according to claim 2, wherein said second coupling means comprises:
   a third p-channel transistor having a source, a drain, a gate, and a body, the drain of the third p-channel transistor is coupled to the body of the first n-channel transistor, the body and source of the third p-channel transistor are coupled to the output terminal of the CMOS buffer, and the gate of the third p-channel transistor is coupled to the input terminal of the CMOS buffer; and
   a third n-channel transistor having a source, a drain, a gate, and a body, the source and body of the third n-channel transistor are coupled to the ground terminal of the CMOS buffer, the drain of the third n-channel transistor is coupled to the body of the first n-channel transistor, and the gate of the third n-channel transistor is coupled to the input terminal of the CMOS buffer.

4. A CMOS buffer according to claim 3, further comprising a buffer having an input terminal and an output terminal, the input terminal of the buffer is coupled to the input terminal of the CMOS buffer, and the output terminal of the buffer is coupled to the gate of the first p-channel transistor and the gate of the first n-channel transistor.

5. A CMOS buffer according to claim 4, wherein the buffer is an inverting buffer.

6. A CMOS buffer according to claim 3, further comprising:
   a first buffer having an input terminal and an output terminal, the input terminal of the first buffer is coupled to the input terminal of the CMOS buffer, and the output terminal of the first buffer is coupled to the gate of the first p-channel transistor; and
   a second buffer having an input terminal and an output terminal, the input terminal of the second buffer is coupled to the input terminal of the CMOS buffer, and the output terminal of the second buffer is coupled to the gate of the first n-channel transistor.

7. A CMOS buffer according to claim 1, further comprising: third coupling means for coupling the gate of the first n-channel transistor to the output terminal of the CMOS buffer when the voltage at the output terminal of the CMOS buffer exceeds the voltage of at power supply terminal of the CMOS buffer by a predetermined amount.

8. A CMOS buffer according to claim 7, where said third coupling means comprises:
   a fourth p-channel transistor having a source, a drain, a gate, and a body, wherein the source and body of the fourth p-channel transistor are coupled to the gate of the first n-channel transistor, and the gate of the fourth p-channel transistor is coupled to the power supply terminal of the CMOS buffer; and
   a fifth p-channel transistor having a source, a drain, a gate, and a body, wherein the source and body of the fifth p-channel transistor are coupled to the output terminal of the CMOS buffer, the drain of the fifth p-channel transistor is coupled to the drain of the fourth p-channel transistor, and the gate of the fifth p-channel transistor is coupled to the power supply terminal of the CMOS buffer.

9. A CMOS buffer according to claim 1, further comprising:
   fourth coupling means for coupling the gate of the first p-channel transistor to the output terminal of the CMOS buffer when the voltage at the output terminal of the CMOS buffer drops below the voltage at ground terminal of the CMOS buffer by a predetermined amount.

10. A CMOS buffer according to claim 9, where said fourth coupling means comprises:
    a fourth n-channel transistor having a source, a drain, a gate, and a body, wherein the source and body of the fourth n-channel transistor are coupled to the gate of the first p-channel transistor, and the gate of the fourth n-channel transistor is coupled to the ground terminal of the CMOS buffer; and
    a fifth n-channel transistor having a source, a drain, a gate, and a body, wherein the source and body of the fifth n-channel transistor are coupled to the output terminal of the CMOS buffer, the drain of the fifth n-channel transistor is coupled to the drain of the fourth n-channel transistor, and the gate of the fifth n-channel transistor is coupled to the ground terminal of the CMOS buffer.

11. A CMOS buffer according to claim 1, further comprising: fifth coupling means for coupling the gate of the first p-channel transistor to the output terminal of the CMOS buffer when the voltage at the output terminal of the CMOS buffer exceeds the voltage at the power supply terminal of the CMOS buffer by a predetermined amount.

12. A CMOS buffer according to claim 11, wherein said fifth coupling means comprises:
    a third p-channel transistor having a source, a drain, a gate, and a body, wherein the source and body of the third p-channel transistor are coupled to the gate of the first p-channel transistor, and the gate of the third p-channel transistor is coupled to the power supply terminal of the CMOS buffer; and
    a fourth p-channel transistor having a source, a drain, a gate, and a body, wherein the source and body of the fourth p-channel transistor are coupled to the output terminal of the CMOS buffer, the drain of the fourth p-channel transistor is coupled to the drain of the third p-channel transistor, and the gate of the fourth p-channel transistor is coupled to the power supply terminal of the CMOS buffer.

13. A CMOS buffer having a power supply terminal, a ground terminal, an input terminal and an output terminal, the CMOS buffer comprising:
    a first buffer having an input terminal, an output terminal, a first power supply terminal and a second power supply terminal, the input terminal of the first buffer is coupled to the input terminal of the CMOS buffer;
    a second buffer having an input terminal and an output terminal, a first power supply terminal and a second power supply terminal, the input terminal of the second buffer is coupled to the input terminal of the CMOS buffer;
    a first p-channel transistor having a source, a drain, a gate, and a body, the source of the first p-channel transistor is coupled to the power supply terminal of the CMOS buffer, the gate of the first p-channel transistor is coupled to the output of the first buffer;
    a first n-channel transistor having a source, a drain, a gate, and a body, the source of the first n-channel transistor is coupled to the ground terminal of the CMOS buffer, the gate of the first n-channel transistor is coupled to the output of the second buffer, and the drain of the first n-channel transistor is coupled to the drain of the first p-channel transistor and further coupled to the output terminal of the CMOS buffer;

a second p-channel transistor having a source, a drain, a gate, and a body, the drain of the second p-channel transistor is coupled to the body of the first n-channel transistor, the body and source of the second p-channel transistor are coupled to the output terminal of the CMOS buffer, and the gate of the second p-channel transistor is coupled to the input terminal of the CMOS buffer;

a second n-channel transistor having a source, a drain, a gate, and a body, the source of the second n-channel transistor is coupled to the body of the first p-channel transistor, the body and drain of the second n-channel transistor are coupled to the output terminal of the CMOS buffer, and the gate of the second n-channel transistor is coupled to the input terminal of the CMOS buffer;

a third n-channel transistor having a source, a drain, a gate, and a body, the drain of the third n-channel transistor is coupled to the body of the first n-channel transistor, and the gate of the third n-channel transistor is coupled to the input terminal of the CMOS buffer;

a third p-channel transistor having a source, a drain, a gate, and a body, the drain of the third p-channel transistor is coupled to the body of the first p-channel transistor, and the gate of the third p-channel transistor is coupled to the input terminal of the CMOS buffer; and a Vdd1 power supply circuit having a Vdd1 power supply terminal, wherein the first power supply terminal of the first buffer is coupled to the Vdd1 power supply terminal of the Vdd1 power supply circuit, and the first power supply terminal of the second buffer is coupled to the Vdd1 power supply terminal of the Vdd1 power supply circuit.

14. A CMOS buffer according to claim 13, wherein the body and source of the third p-channel transistor are coupled to the Vdd1 power supply terminal of the Vdd1 power supply circuit.

15. A CMOS buffer according to claim 14, further comprising a Vss1 power supply circuit having a Vss1 power supply terminal, wherein the second power supply terminal of the first buffer is coupled to the Vss1 power supply terminal of the Vss1 power supply circuit, and the second power supply terminal of the second buffer is coupled to the Vss1 power supply terminal of the Vss1 power supply circuit.

16. A CMOS buffer according to claim 15, wherein the body and source of the third n-channel transistor are coupled to the Vss1 power supply terminal of the Vss1 power supply circuit.

17. A CMOS buffer according to claim 13, wherein the Vdd1 power supply circuit includes means for connecting the power supply terminal of the CMOS buffer to the Vdd1 power supply terminal of the Vdd1 power supply circuit when the voltage at the output terminal of the CMOS buffer is below the voltage at the power supply terminal of the CMOS buffer, and for connecting the output terminal of the CMOS buffer to the Vdd1 power supply terminal when the voltage at the output terminal of the CMOS buffer exceeds the voltage at the power supply terminal of the CMOS buffer by a predetermined amount.

18. A CMOS buffer according to claim 17, wherein said connecting means comprises:

a fourth p-channel transistor having a source, a drain, a gate, and a body, the source and body of the fourth p-channel transistor are coupled to the output terminal of the CMOS buffer, and the gate of the fourth p-channel transistor is coupled to the power supply terminal of the CMOS buffer;

a fourth n-channel transistor having a source, a drain, a gate, and a body, the source and body of the fourth n-channel transistor are coupled to the ground terminal of the CMOS buffer, and the gate of the fourth n-channel transistor is coupled to the power supply terminal of the CMOS buffer;

a fifth p-channel transistor having a source, a drain, a gate, and a body, the source and body of the fifth p-channel transistor are coupled to the Vdd1 power supply terminal of the Vdd1 power supply circuit, the drain of the fifth p-channel transistor is coupled to the power supply terminal of the CMOS buffer, and the gate of the fifth p-channel transistor is coupled to the drain of the fourth p-channel transistor and the drain of the fourth n-channel transistor;

a sixth p-channel transistor having a source, a drain, a gate, and a body, wherein the source and body of the sixth p-channel transistor are coupled to the Vdd1 power supply terminal of the Vdd1 power supply circuit, and the gate of the sixth p-channel transistor is coupled to the power supply terminal of the CMOS buffer; and a seventh p-channel transistor having a source, a drain, a gate, and a body, wherein the source and body of the seventh p-channel transistor are coupled to the output terminal of the CMOS buffer, the drain of the seventh p-channel transistor is coupled to the drain of the sixth p-channel transistor, and the gate of the seventh p-channel transistor is coupled to the power supply terminal of the CMOS buffer.

19. A CMOS buffer according to claim 15, wherein the Vss1 power supply circuit includes means for connecting the ground terminal of the CMOS buffer to the Vss1 power supply terminal of the Vss1 power supply circuit when the voltage at the output terminal of the CMOS buffer is above the voltage at the ground terminal of the CMOS buffer, and for connecting the output terminal of the CMOS buffer to the Vss1 power supply terminal when the voltage at the output terminal of the CMOS buffer drops below the voltage at the ground terminal of the CMOS buffer by a predetermined amount.

20. A CMOS buffer according to claim 19, wherein said connecting means comprises:

a fourth p-channel transistor having a source, a drain, a gate, and a body, the source and body of the fourth n-channel transistor are coupled to the power supply terminal of the CMOS buffer, and the gate of the fourth p-channel transistor is coupled to the ground terminal of the CMOS buffer;

a fourth n-channel transistor having a source, a drain, a gate, and a body, the source and body of the fourth n-channel transistor are coupled to the output terminal of the CMOS buffer, and the gate of the fourth n-channel transistor is coupled to the ground terminal of the CMOS buffer;

a fifth n-channel transistor having a source, a drain, a gate, and a body, the source and body of the fifth n-channel transistor are coupled to the Vss1 power supply terminal of the Vss1 power supply circuit, the drain of the fifth n-channel transistor is coupled to the ground terminal of the CMOS buffer, and the gate of the fifth n-channel transistor is coupled to the drain of the fourth p-channel transistor and the drain of the fourth n-channel transistor;

a sixth n-channel transistor having a source, a drain, a gate, and a body, wherein the source and body of the sixth n-channel transistor are coupled to the Vss1 power supply terminal of the Vss1 power supply circuit, and the gate of the sixth n-channel transistor is coupled to the ground terminal of the CMOS buffer; and a seventh n-channel transistor having a source, a drain, a gate, and a body, wherein the source and body of the seventh n-channel transistor are coupled to the output terminal of the CMOS buffer, the drain of the seventh n-channel transistor is coupled to the drain of the sixth n-channel transistor, and the gate of the seventh n-channel transistor is coupled to the ground terminal of the CMOS buffer.

21. A CMOS buffer according to claim 19, wherein said connecting means comprises:

a fourth p-channel transistor having a source, a drain, a gate, and a body, the source and body of the fourth p-channel transistor are coupled to the power supply terminal of the CMOS buffer, and the gate of the fourth p-channel transistor is coupled to the ground terminal of the CMOS buffer;

a fourth n-channel transistor having a source, a drain, a gate, and a body, the source and body of the fourth n-channel transistor are coupled to the output terminal of the CMOS buffer, and the gate of the fourth n-channel transistor is coupled to the ground terminal of the CMOS buffer;

a fifth n-channel transistor having a source, a drain, a gate, and a body, the source and body of the fifth n-channel transistor are coupled to the drain of the fourth p-channel transistor, the source of the fifth n-channel transistor is coupled to the drain of the fourth n-channel transistor, and the gate of the fifth n-channel transistor is coupled to the ground terminal of the CMOS buffer;

a sixth n-channel transistor having a source, a drain, a gate, and a body, the drain and body of the sixth n-channel transistor are coupled to the Vss1 power supply terminal of the Vss1 power supply circuit, the source of the sixth n-channel transistor is coupled to the ground terminal of the CMOS buffer, and the gate of the sixth n-channel transistor is coupled to the drain of the fifth n-channel transistor and the drain of the fourth p-channel transistor;

a seventh n-channel transistor having a source, a drain, a gate, and a body, the drain and body of the seventh n-channel transistor is coupled to the Vss1 power supply terminal of the Vss1 power supply circuit, the source of the seventh n-channel transistor is coupled to the ground terminal of the CMOS buffer, and the gate of the seventh n-channel transistor is coupled to the output terminal of the CMOS buffer;

an eighth n-channel transistor having a source, a drain, a gate, and a body, the source and body of the eighth n-channel transistor are coupled to the Vss1 power supply terminal of the Vss1 power supply circuit, the gate of the eighth n-channel transistor is coupled to the ground terminal of the CMOS buffer; and a ninth n-channel transistor having a source, a drain, a gate, and a body, the source and body of the ninth n-channel transistor are coupled to the output terminal of the CMOS buffer, the drain of the ninth n-channel transistor is coupled to the drain of the eighth n-channel transistor, and the gate of the ninth n-channel transistor is coupled to the ground terminal of the CMOS buffer.

22. A CMOS buffer according to claim 13, further comprising:

a fourth p-channel transistor having a source, a drain, a gate, and a body, wherein the source and body of the fourth p-channel transistor are coupled to the gate of the first n-channel transistor, and the gate of the fourth p-channel transistor is coupled to the power supply terminal of the CMOS buffer;

a fifth p-channel transistor having a source, a drain, a gate, and a body, wherein the source and body of the fifth p-channel transistor are coupled to the output terminal of the CMOS buffer, the drain of the fifth p-channel transistor is coupled to the drain of the fourth p-channel transistor, and the gate of the fifth p-channel transistor is coupled to the power supply terminal of the CMOS buffer;

a fourth n-channel transistor having a source, a drain, a gate, and a body, wherein the source and body of the fourth n-channel transistor are coupled to the gate of the first p-channel transistor, and the gate of the fourth n-channel transistor is coupled to the ground terminal of the CMOS buffer; and a fifth n-channel transistor having a source, a drain, a gate, and a body, wherein the source and body of the fifth n-channel transistor are coupled to the output terminal of the CMOS buffer, the drain of the fifth n-channel transistor is coupled to the drain of the fourth n-channel transistor, and the gate of the fifth n-channel transistor is coupled to the ground terminal of the CMOS buffer.

23. A CMOS buffer according to claim 22, further comprising:

a sixth p-channel transistor having a source, a drain, a gate, and a body, wherein the source and body of the sixth p-channel transistor are coupled to the gate of the first p-channel transistor, and the gate of the sixth p-channel transistor is coupled to the power supply terminal of the CMOS buffer; and a seventh p-channel transistor having a source, a drain, a gate, and a body, wherein the source and body of the seventh p-channel transistor are coupled to the output terminal of the CMOS buffer, the drain of the seventh p-channel transistor is coupled to the drain of the sixth p-channel transistor, and the gate of the seventh p-channel transistor is coupled to the power supply terminal of the CMOS buffer.

* * * * *